(12) United States Patent
Gupta et al.

(10) Patent No.: US 8,952,418 B2
(45) Date of Patent: Feb. 10, 2015

(54) GATED BIPOLAR JUNCTION TRANSISTORS

(75) Inventors: Rajesh N. Gupta, Alviso, CA (US);
Farid Nemati, Redwood City, CA (US);
Scott T. Robins, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 530 days.

(21) Appl. No.: 13/037,642

(22) Filed: Mar. 1, 2011

(65) Prior Publication Data

US 2012/0223369 A1    Sep. 6, 2012

(51) Int. Cl.
*H01L 29/74*    (2006.01)
*H01L 29/73*    (2006.01)
*H01L 27/102*   (2006.01)
*H01L 29/735*   (2006.01)
*H01L 27/108*   (2006.01)
*H01L 29/78*    (2006.01)

(52) U.S. Cl.
CPC .......... *H01L 29/73* (2013.01); *H01L 27/1024* (2013.01); *H01L 29/735* (2013.01); *H01L 27/1023* (2013.01); *H01L 27/1026* (2013.01); *H01L 27/10802* (2013.01); *H01L 29/7841* (2013.01)
USPC ........... 257/107; 257/119; 257/122; 257/162; 257/E21.661; 257/E21.703; 257/E27.099; 257/E27.112; 257/E29.022; 257/E29.195; 257/E29.211; 257/E29.212; 257/E29.213; 257/E29.214; 257/E29.337; 438/133; 438/139; 361/245

(58) Field of Classification Search
USPC .................. 257/122, 107, 119, 162, E21.661, 257/E21.703, E27.099, E27.112, E29.022, 257/E29.195, E29.211, E29.212, E29.213, 257/E29.214, E29.337; 438/133, 139; 361/245
See application file for complete search history.

(56) References Cited

U.S. PATENT DOCUMENTS 5,465,249 A   11/1995   Cooper, Jr. et al.
5,510,630 A    4/1996   Agarwal et al.
(Continued)

FOREIGN PATENT DOCUMENTS

TW        101106601           4/2014
WO   PCT/US2012/025115      10/2012
WO   PCT/US2012/025115       9/2013

OTHER PUBLICATIONS

Burke et al., "Silicon Carbide Thyristors for Power Applications", Pulsed Power Conference, 1995. Digest of Technical Papers., Tenth IEEE International, vol. 1, Jul. 3, 1995, pp. 327-335.
(Continued)

*Primary Examiner* — Meiya Li
(74) *Attorney, Agent, or Firm* — Wells St. John P.S.

(57) ABSTRACT

Some embodiments include gated bipolar junction transistors. The transistors may include a base region between a collector region and an emitter region; with a B-C junction being at an interface of the base region and the collector region, and with a B-E junction being at an interface of the base region and the emitter region. The transistors may include material having a bandgap of at least 1.2 eV within one or more of the base, emitter and collector regions. The gated transistors may include a gate along the base region and spaced from the base region by dielectric material, with the gate not overlapping either the B-C junction or the B-E junction. Some embodiments include memory arrays containing gated bipolar junction transistors. Some embodiments include methods of forming gated bipolar junction transistors.

22 Claims, 15 Drawing Sheets

(56) References Cited

U.S. PATENT DOCUMENTS

| | | | |
|---|---|---|---|
| 5,963,469 A | 10/1999 | Forbes | |
| 6,033,957 A | 3/2000 | Burns, Jr. et al. | |
| 6,225,151 B1* | 5/2001 | Gardner et al. | 438/162 |
| 6,627,924 B2 | 9/2003 | Hsu et al. | |
| 6,940,761 B2 | 9/2005 | Forbes | |
| 7,151,024 B1 | 12/2006 | Forbes | |
| 7,180,135 B1 | 2/2007 | Ionannou | |
| 7,362,609 B2 | 4/2008 | Harrison et al. | |
| 7,663,188 B2 | 2/2010 | Chung | |
| 2006/0124974 A1* | 6/2006 | Cabral et al. | 257/274 |
| 2007/0012945 A1* | 1/2007 | Sugizaki | 257/124 |
| 2007/0127289 A1 | 6/2007 | Lee | |
| 2010/0006938 A1 | 1/2010 | Jang | |
| 2010/0008139 A1 | 1/2010 | Bae | |
| 2010/0061145 A1 | 3/2010 | Weis | |
| 2010/0207180 A1 | 8/2010 | Lee | |
| 2010/0277982 A1 | 11/2010 | Okhonin | |

OTHER PUBLICATIONS

Cheong et al., "Investigation of Ultralow Leakage in MOS Capacitors on 4H SiC", IEEE Transactions on Electron Devices, vol. 51(9), Sep. 2004, pp. 1361-1365.

Dimitriadis et al., "New a-SiC, Optically Controlled, Thyristor-Like Switch", Electronics Letters, vol. 28(17), Aug. 13, 1992, pp. 1622-1624.

Jen et al., "Electrical and Luminescent Characteristics of a-SiC:H P-I-N Thin-Film LED's with Graded-Gap Junctions", IEEE Transactions on Electron Devices, vol. 44(4), Apr. 1997, pp. 565-571.

Powell et al., "SiC Materials—Progress, Status, and Potential Roadblocks", Proceedings of the IEEE, vol. 90(6), Jun. 2002, pp. 942-955.

Xie et al., "A Vertically Integrated Bipolar Storage Cell in 6H Silicon Carbide for Nonvolatile Memory Applications", IEEE Electron Device Letters, vol. 15(6), Jun. 1994, pp. 212-214.

* cited by examiner

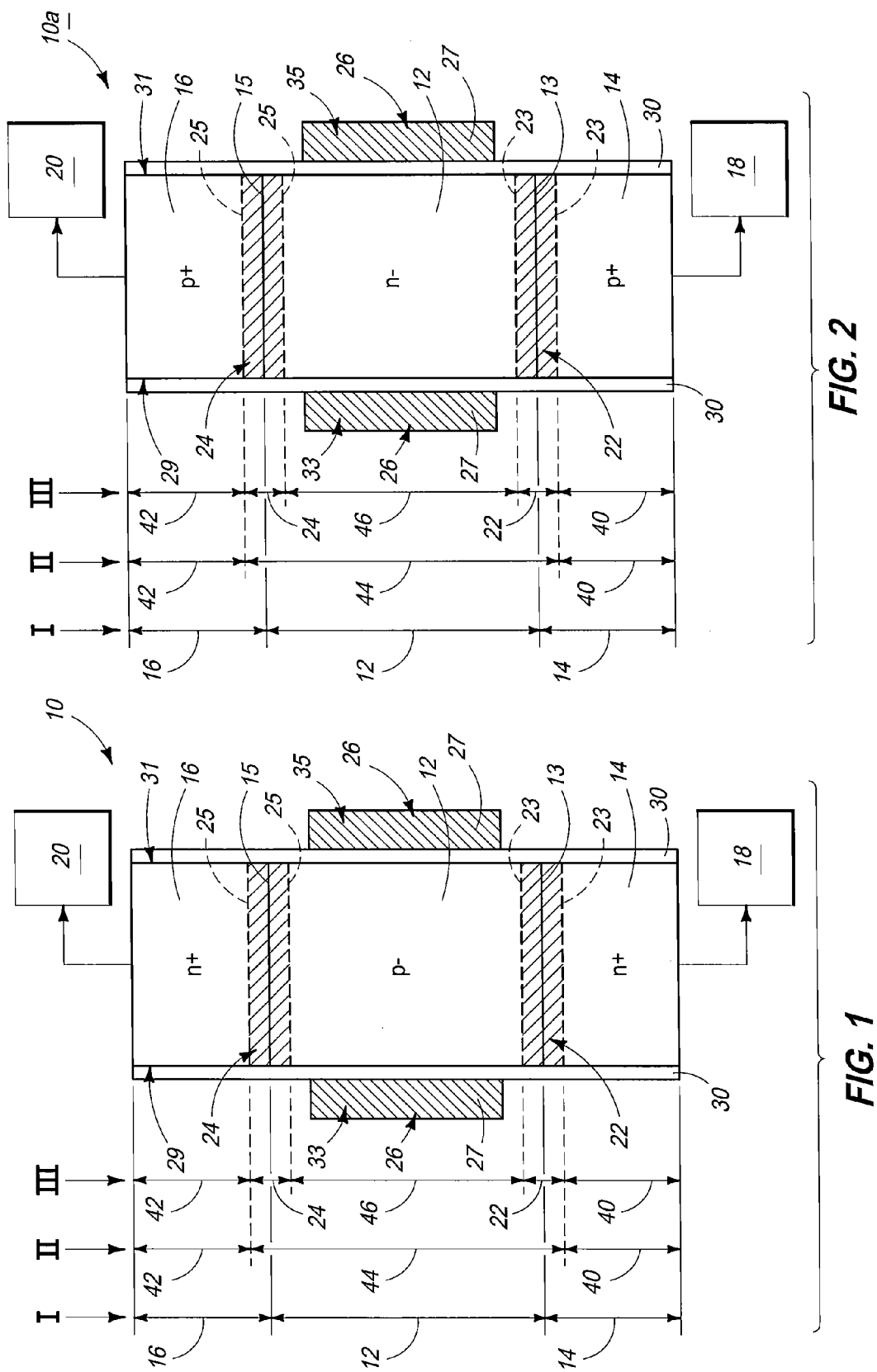

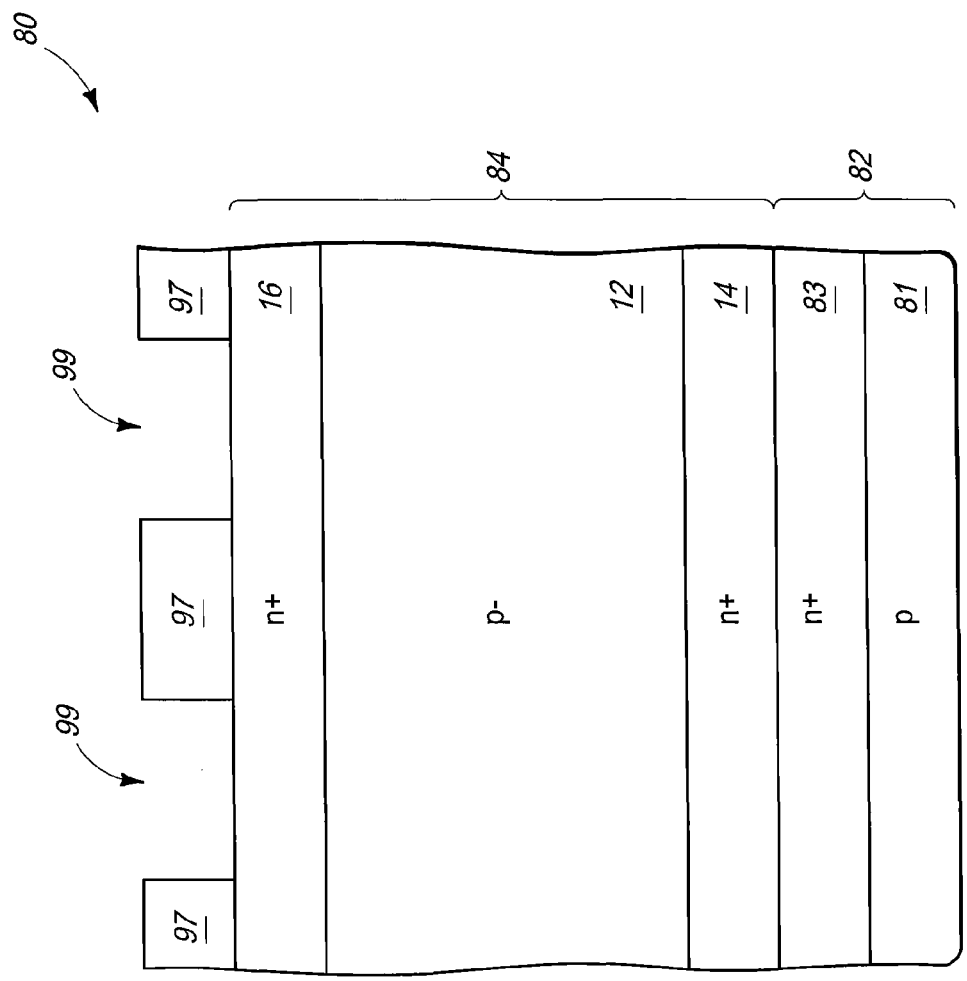

US 8,952,418 B2

GATED BIPOLAR JUNCTION TRANSISTORS

TECHNICAL FIELD

Gated bipolar junction transistors, memory arrays, and methods of forming gated bipolar junction transistors.

BACKGROUND

Memory is one type of integrated circuitry, and is used in computer systems for storing data. Integrated memory is usually fabricated in one or more arrays of individual memory cells. The memory cells might be volatile, semi-volatile, or nonvolatile. Nonvolatile memory cells can store data for extended periods of time, and in some instances can store data in the absence of power. Non-volatile memory is conventionally specified to be memory having a retention time of at least about 10 years. Volatile memory dissipates, and is therefore refreshed/rewritten to maintain data storage. Volatile memory may have a retention time of milliseconds, or less.

The memory cells are configured to retain or store memory in at least two different selectable states. In a binary system, the states are considered as either a "0" or a "1". In other systems, at least some individual memory cells may be configured to store more than two levels or states of information.

Nonvolatile memory may be used in applications in which it is desired to retain data in the absence of power. Nonvolatile memory may also be used in applications in which power is a limited resource (such as in battery-operated devices) as an alternative to volatile memory because nonvolatile memory may have the advantage that it can conserve power relative to volatile memory. However, read/write characteristics of non-volatile memory may be relatively slow in comparison to volatile memory, and/or nonvolatile memory may have limited endurance (for instance, nonvolatile memory may only function for about $10^5$ read/write cycles before failure). Thus, volatile memory is still often used, even in devices having limited reserves of power. It would be desirable to develop improved nonvolatile memory and/or improved semi-volatile memory. It would be further desirable to develop memory cells that are nonvolatile or semi-volatile, while having suitable read/write characteristics and endurance to replace conventional volatile memory in some applications.

Integrated circuitry fabrication continues to strive to produce smaller and denser integrated circuits. It can be desired to develop small-footprint memory cells in order to conserve the valuable real estate of an integrated circuit chip. For instance, it can be desired to develop memory cells that have a footprint of less than or equal to $4F^2$, where "F" is the minimum dimension of masking features utilized to form the memory cells.

It would be desirable to develop new memory cells which can be non-volatile or semi-volatile, and which have may have a footprint approaching $4F^2$.

BRIEF DESCRIPTION OF THE DRAWINGS

FIG. 1 is a diagrammatic cross-sectional view of an example embodiment memory cell.

FIG. 2 is a diagrammatic cross-sectional view of another example embodiment memory cell.

FIGS. 17 and 18 diagrammatically illustrate process stages of an example embodiment method for fabricating an array of memory cells.

DETAILED DESCRIPTION OF THE ILLUSTRATED EMBODIMENTS

Figure 4:
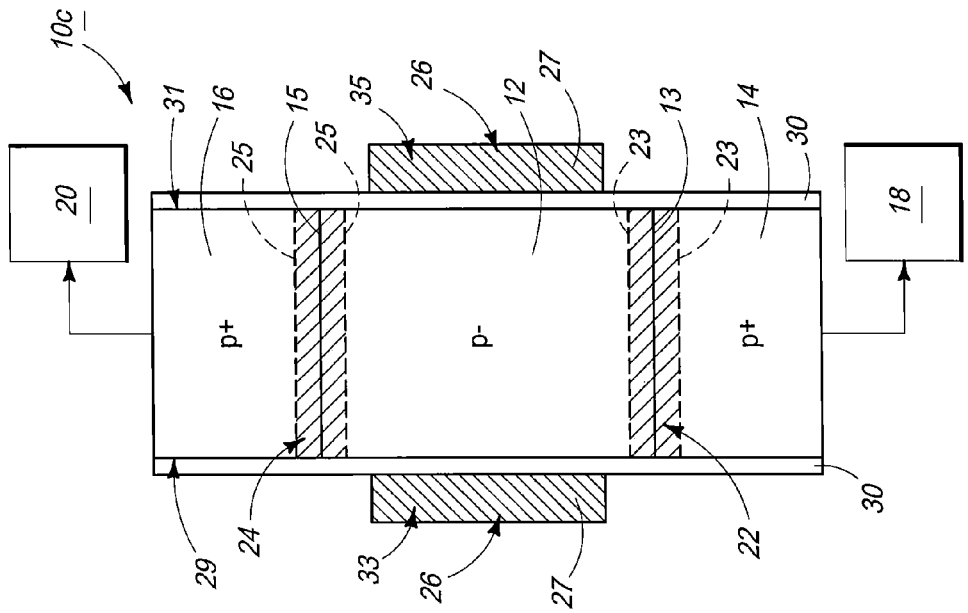
FIG. 4 is a diagrammatic cross-sectional view of another example embodiment memory cell.

Some embodiments include memory cells comprising one or more wide-bandgap materials; with a "wide-bandgap material" being a material having a bandgap measurably greater than the 1.12 eV bandgap of silicon. In some embodiments, the wide-bandgap material may have a bandgap of 1.2 eV or greater. In some embodiments, the wide-bandgap material may have a bandgap of 2.3 eV or greater, and may, for example, comprise one or more forms of silicon carbide.

The memory cells may be gated bipolar junction transistors (BJTs), and may comprise electrically floating bodies. In some embodiments, the wide-bandgap material may be utilized in the floating bodies and/or in depletion regions adjacent the floating bodies. Such utilization of the wide-bandgap material may enable formation of random access memory (RAM) having longer retention time than conventional dynamic random access memory (DRAM), while also having suitably fast read/write characteristics to substitute for conventional DRAM in some applications. Additionally, or alternatively, the wide-bandgap material may enable formation of memory having retention times of several years, and thus may enable formation of nonvolatile memory. In some embodiments, the nonvolatile memory may have endurance approaching, or even exceeding, the endurance of conventional DRAM (such as endurance suitable to survive $10^6$ or more read/write cycles).

Example gated BJT memory cells are described with reference to FIGS. 1-4.

Referring to FIG. 1, a memory cell 10 comprises a base region 12 between a pair of emitter/collector regions 14 and 16. The regions 12, 14 and 16 may be comprised by a pillar-type structure in some embodiments, and such structure may be referred to as a BJT pillar.

The emitter/collector region 14 interfaces with the base region 12 at a junction 13, and similarly the emitter/collector region 16 interfaces with the base region 12 at a junction 15. In operation, one of the emitter/collector regions will be the emitter region of the BJT device, and the other will be the collector region of the device. The junction between the base region and the emitter region may be referred to as a B-E junction, and the junction between the base region and the collector region may be referred to as a B-C junction.

The emitter/collector regions 14 and 16 are shown to be electrically coupled to electrical nodes 18 and 20, respectively. One of the nodes 18 and 20 may correspond to a bitline (i.e., a digit line or sense line). The other of the nodes 18 and 20 may correspond to a wordline (i.e., an access line) in some embodiments, or to a ground or other electrically static structure in other embodiments.

Figure 3:
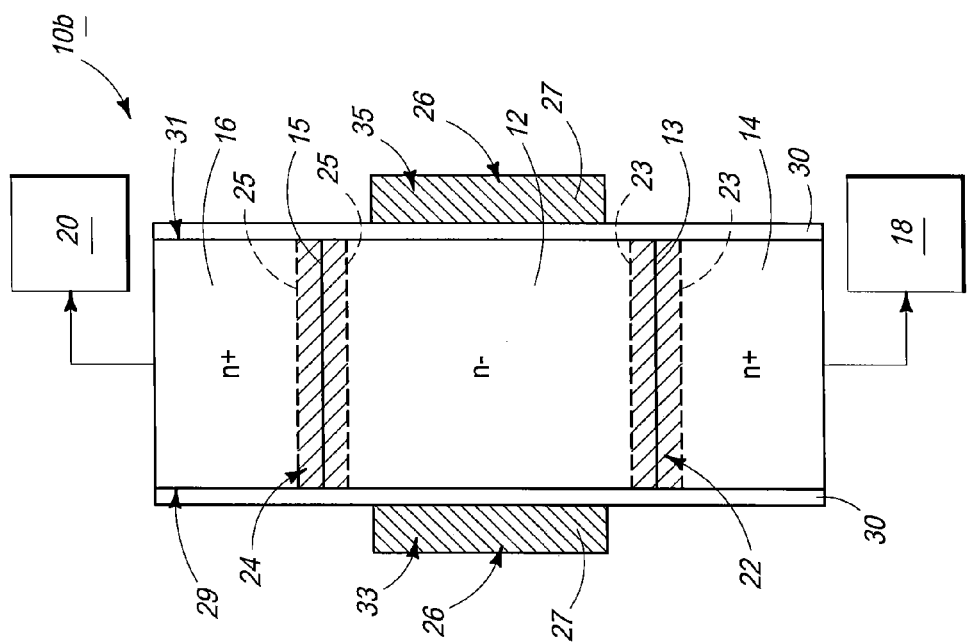
FIG. 3 is a diagrammatic cross-sectional view of another example embodiment memory cell.

The illustrated BJT of memory cell 10 has the base oppositely doped to the emitter/collector regions; and specifically comprises a p-type base and n-type emitter/collector regions. In other embodiments, the base region and emitter/collector regions may comprise other doping arrangements, as illustrated in FIGS. 2-4.

The symbols "+" and "−" are utilized in FIG. 1 (and various other figures of this disclosure) to indicate dopant levels. Some or all of the designations p+, p, p−, n−, n and n+ may be used to indicate various levels and types of doping. The difference in dopant concentration between the regions identified as being p+, p, and p− may vary depending on the particular material being doped. An example dopant concentration of a p+ region is a dopant concentration of at least about $10^{19}$ atoms/cm$^3$ (and in some example applications may be from about $10^{19}$ atoms/cm$^3$ to about $10^{20}$ atoms/cm$^3$), an example dopant concentration of a p region is from about $10^{18}$ to about $10^{19}$ atoms/cm$^3$, and an example dopant concentration of a p− region is less than about $5\times10^{18}$ atoms/cm$^3$ (and in some embodiments may be less than or equal to about $5\times10^{17}$ atoms/cm$^3$). The regions identified as being n−, n and n+ may have dopant concentrations similar to those described above relative to the p−, p and p+ regions, respectively.

It is noted that the terms "p" and "n" can be utilized herein to refer to both dopant type and relative dopant concentrations. The terms "p" and "n" are to be understood as referring only to dopant type, and not to a relative dopant concentration, except when it is explicitly stated that the terms refer to relative dopant concentrations. Accordingly, for purposes of interpreting this disclosure and the claims that follow, it is to be understood that the terms "p-type doped" and n-type doped" refer to dopant types of a region and not to relative dopant levels. Thus, a p-type doped region can be doped to any of the p+, p, and p− dopant levels discussed above, and similarly an n-type doped region can be doped to any of the n+, n, and n− dopant levels discussed above.

The dopants utilized in memory cell 10 may be any suitable dopants. In some embodiments, at least part of the memory cell will comprise wide-bandgap material. An example wide-bandgap material is silicon carbide, and such may be n-type doped with, for example, one or more of N (such as from $N_2$ and/or $NH_3$), P (such as from $PH_3$) and As (such as from $AsH_3$). Alternatively, the silicon carbide may be p-type doped with, for example, one or more of B (such as from $B_2H_6$), Al (such as from $AlCl_3$, trimethylaluminum and triethylaluminum) and Ga (such as from trimethylgallium).

In operation, depletion regions 22 and 24 may be induced between base region 12 and the emitter/collector regions 14 and 16, respectively. The depletion regions are diagrammatically illustrated with cross-hatching. Approximate boundaries of the depletion region 22 are illustrated with dashed lines 23, and approximate boundaries of the depletion region 24 are illustrated with dashed lines 25.

The memory cell 10 has a gate 26 along the base region 12. In operation, the base region may comprise an electrically floating body of the memory cell. The gate may be used to enable charge to be selectively stored on such floating body, or to be drained from the floating body. Thus, the memory cell may have two selectable memory states, with one of the states having more charge stored on base region 12 than the other state.

The illustrated BJT is configured as a vertical pillar having a pair of opposing sidewalls 29 and 31, and the gate 26 is shown to be bifurcated into a pair of segments 33 and 35, with each segment being along one of the opposing sidewalls. In some embodiments, the illustrated memory cell may be one of a plurality of memory cells of a memory array, and the illustrated segments 33 and 35 of the gate may correspond to a pair of lines that extend along multiple memory cells of a row or column of the array to interconnect multiple memory cells. Such lines would extend in and out of the page relative to the cross-sectional view of FIG. 1. The segments 33 and 35 may join with one another at some location outside of the view of FIG. 1 so that the illustrated segments 33 and 35 are actually two parts of the same gate.

The gate 26 comprises a material 27. Such material may comprise any suitable substance, and may, for example, comprise one or more of various metals (for instance, titanium, tungsten, etc.), metal-containing compositions (for instance, metal silicide, metal nitride, etc.), and conductively-doped semiconductor materials (for instance, conductively-doped silicon, conducted-doped geranium, etc.).

The gate 26 is spaced from the sidewalls 29 and 31 of the BJT pillar by dielectric material 30. The dielectric material may comprise any suitable composition or combination of compositions. In some embodiments, at least a portion of the BJT pillar comprises one or more forms of silicon carbide, and at least a portion of the dielectric material 30 that is directly against the silicon carbide comprises a passivation composition containing silicon, oxygen and nitrogen. Such passivation composition may be formed by chemically reacting a surface of the silicon carbide with oxygen and nitrogen, and/or by depositing a composition containing silicon, oxygen and nitrogen along the surface of the silicon carbide.

In some embodiments, an entirety of dielectric material 30 may comprise the passivation composition containing silicon, oxygen and nitrogen. In other embodiments, the dielectric material 30 may comprise two or more different compositions, with the composition directly against surfaces of the BJT pillar being the passivation material, and with one or more other compositions being between the passivation material and the gate 26. Such other compositions may comprise, for example, one or both of silicon dioxide and silicon nitride.

In the shown embodiment, the gate 26 is along base region 12 of the BJT, but does not overlap the B-C and B-E junctions 13 and 15. Further, the gate does not overlap the depletion regions 22 and 24 during operation of the BJT. In the shown configuration in which the BJT is within a vertical pillar, the gate 26 may be considered to vertically overlap the base region, and to not vertically overlap the depletion regions 22 and 24.

It can be advantageous for gate 26 to not overlap depletion regions 22 and 24 in that such can alleviate or eliminate a source of leakage within the memory cell. Specifically, a gated BJT memory cell may have primary leakage mechanisms that include gate-induced leakage (which may be referred to as gate-induced-drain-leakage, i.e., GIDL), base/ emitter junction leakage, and base/collector junction leakage. If the gate 26 overlaps the depletion regions, then a significant leakage mechanism within the memory cell may be gate-induced leakage, and such may be a much larger contribution to the leakage within the memory cell than the combination of intrinsic base/emitter junction leakage and intrinsic base/collector junction leakage. In the shown example embodiment of FIG. 1, the gate does not overlap the depletion regions, and thus only couples with the base region. Accordingly, the gate-induced leakage, if any, may be a small contribution to the overall leakage within the memory cell; and thus the overall leakage through the memory cell may be limited to the intrinsic leakage of the two junctions. This can enable the memory cell of FIG. 1 to have much longer retention times than conventional DRAM, and in some embodiments to have retention times suitable for utilization in nonvolatile memory.

The BJT pillar of memory cell 10 may be considered to be subdivided into numerous regions, as explained with reference to the scales I, II and III shown in FIG. 1.

Scale I illustrates that the BJT pillar may be considered to comprise a first emitter/collector region 14, a base region 12, and a second emitter/collector region 16. The regions 12 and 14 interface at the junction 13, and the regions 12 and 16 interface at the junction 15.

Scale II illustrates that the BJT pillar may be considered to comprise a first outer region 40 corresponding to the portion of the emitter/collector region 14 that is outward of the depletion region 22, a second outer region 42 corresponding to the portion of the emitter/collector region 16 that is outward of the depletion region 24, and an inner region 44 between the outer regions 40 and 42. The inner region 44 interfaces with outer region 40 at an outermost edge of depletion region 22, and interfaces with outer region 42 at an outermost edge of depletion region 24.

Scale III illustrates that the BJT pillar may be considered to comprise the outer regions 40 and 42, the depletion regions 22 and 24, and a neutral base region (or floating body region) 46 between the depletion regions.

As discussed above, the BJT pillar may comprise one or more wide-bandgap materials. The wide-bandgap materials may advantageously improve retention time of the memory cell relative to narrower-bandgap materials (such as silicon) by reducing leakage within the memory cell. In some embodiments, wide-bandgap material is provided at least across the junctions 13 and 15 in wide enough expanses to fully encompass depletion regions 22 and 24. Thus, the wide-bandgap material is provided across the locations where the wide-bandgap material may reduce base/collector junction leakage and base/emitter junction leakage. In some embodiments, the wide-bandgap material may be provided as strips extending across depletion regions 22 and 24, and thus the regions 40, 46 and 42 of scale III may be narrow-bandgap materials (such as silicon). In such embodiments, the wide-bandgap material across depletion region 22 may be the same composition as the wide-bandgap material across depletion region 24, or may be a different composition to tailor the BJT for a particular application of the memory cell 10.

Possible means by which the wide bandgap materials may reduce leakage within the BJT are as follows. Intrinsic leakage may be considered to be derived through two different mechanisms, and to approximately correspond to whichever of the mechanisms predominates. One of the mechanisms is generation of intrinsic carriers in depletion regions, and the other is diffusion of intrinsic carriers in the neutral regions.

The concentration of intrinsic carriers ($n_i$) may be represented by Equation I:

$$n_i = e^{\left(\frac{-Eg}{2kT}\right)} \quad \text{Equation I}$$

In Equation I, $E_g$ is the bandgap, T is temperature, and k is Boltzmann's constant. Intrinsic leakage will be approximately proportional to $n_i$ for a leakage mechanism corresponding to generation of intrinsic carriers in depletion regions, and will be approximately proportional to $(n_i)^2$ (i.e., the squared concentration of intrinsic carriers) for a leakage mechanism corresponding to diffusion of intrinsic carriers in neutral regions. In either event, an increase in bandgap exponentially reduces $n_i$, and thus exponentially reduces leakage. Further, since the leakage mechanism corresponding to diffusion of intrinsic carriers in neutral regions is proportional to $(n_i)^2$, while the leakage mechanism corresponding to generation of intrinsic carriers in depletion regions is proportional to $n_i$, the leakage mechanism corresponding to diffusion of intrinsic carriers in neutral regions reduces very quickly with increasing bandgap so that the leakage mechanism corresponding to generation of intrinsic carriers in depletion regions is the predominant leakage mechanism for wide-bandgap materials.

The reduction in leakage obtained utilizing wide-bandgap materials may be enormous. For instance, substitution of 3C-SiC (bandgap 2.52 eV) for silicon (bandgap 1.12 eV) may decrease $n_i$ by about 10 orders of magnitude (i.e., $10^{10}$) at 85° C. Retention may be directly proportional to leakage (all other things being equal), and thus a memory cell utilizing 3C-SiC may have 10 orders of magnitude better retention than an analogous memory cell utilizing silicon. In some embodiments, a memory cell utilizing 3C-SiC may have a retention time of at least about 10 years, or even at least about 20 years.

The wide-bandgap materials may be provided anywhere in the BJT pillar where leakage may be problematic. For instance, it may be advantageous to provide wide-bandgap material across the region 40 of scale III when such region corresponds to an emitter region of the BJT (such as, for example, if the BJT is an npn BJT, the node 20 is a bitline, and the memory cell is operated in accordance with methodology described below with reference to FIGS. 5 and 6). In such embodiments, the wide-bandgap material across region 40 may be the same or different than the wide-bandgap material across one or both of the depletion regions 22 and 24. It may also be advantageous to provide wide-bandgap material within the regions 42 and 46 of scale III either to prevent leakage, or to simplify fabrication of memory cell 10 in embodiments in which wide-bandgap material as provided within depletion regions 22 and 24. Accordingly, in some embodiments wide-bandgap material is provided across all of the regions 40, 22, 46, 24 and 42 of scale III. In such embodiments, the same wide-bandgap material may be provided across all of the regions 40, 22, 46, 24 and 42 so that the entirety of the vertical BJT pillar comprises, consists essentially of, or consists of only one wide-bandgap material. In other embodiments, one or more of the regions 40, 22, 46, 24 and 42 may comprise a different wide-bandgap material than another region to tailor the memory cell 10 for a particular application.

In some embodiments, wide-bandgap material may be provided across region 44 of scale II to extend across the base region 12 and the depletion regions 22 and 24. In such embodiments, the wide-bandgap material may also extend across one or both of the regions 40 and 42 of the scale II. For instance, it may be advantageous for the wide-bandgap material to extend across region 40 if region 40 is an emitter region of the BJT. Further, it may be advantageous for the wide-bandgap material to extend across region 42, either to alleviate a leakage mechanism, or to simplify fabrication of the memory cell having the wide-bandgap material in region 44. If wide-bandgap material extends across one or both of regions 40 and 42, in addition to region 44, the material may be the same across all of the regions 40, 44 and 42, or may differ in one or both of the regions 40 and 42 relative to region 44 to tailor the memory cell 10 for a particular application.

The wide-bandgap material may comprise any suitable composition. In some embodiments, the wide-bandgap material may comprise silicon and carbon, and may comprise one or more forms of silicon carbide. For instance, the wide-bandgap material may comprise, consist essentially of, or consist of the 3C form of silicon carbide in some embodiments, and thus may have a bandgap greater than 2.3 eV (specifically, such form of SiC has a bandgap of 2.36 eV).

FIG. 2 shows an example embodiment memory cell 10a analogous to the memory cell 10 of FIG. 1, but comprising a pnp BJT rather than an npn BJT. The memory cell 10a of FIG. 2 is labeled with identical numbering to that used above to describe FIG. 1, and comprises identical features as the memory cell of FIG. 1 except for the different dopant type utilized in the base and emitter/collector regions.

FIGS. 3 and 4 show example embodiment memory cells 10b and 10c, respectively. The memory cells 10b and 10c are analogous to the memory cell 10 of FIG. 1, but comprise a same conductivity type throughout the base 12 and the emitter/collector regions 14 and 16. The dopant level in the base region is, however, less than the dopant levels in the base/collector regions. The memory cells 10b and 10c of FIGS. 3 and 4 are labeled with identical numbering to that used above to describe FIG. 1, and comprise identical features as the memory cell of FIG. 1 except for the dopant types utilized in the base and emitter/collector regions. The junctions 13 and 15 of FIGS. 3 and 4 differ from those of FIG. 1 in that they are interfaces where different dopant levels meet, rather than being interfaces where different dopant types meet. In operation, the gates 26 of the memory cells 10b and 10c may electrically induce a change in dopant type within the base regions coupled to such gates so that the BJTs of the memory cells function as npn and pnp BJTs, respectively, even though the BJTs are not initially doped as npn or pnp BJTs.

Figure 5:
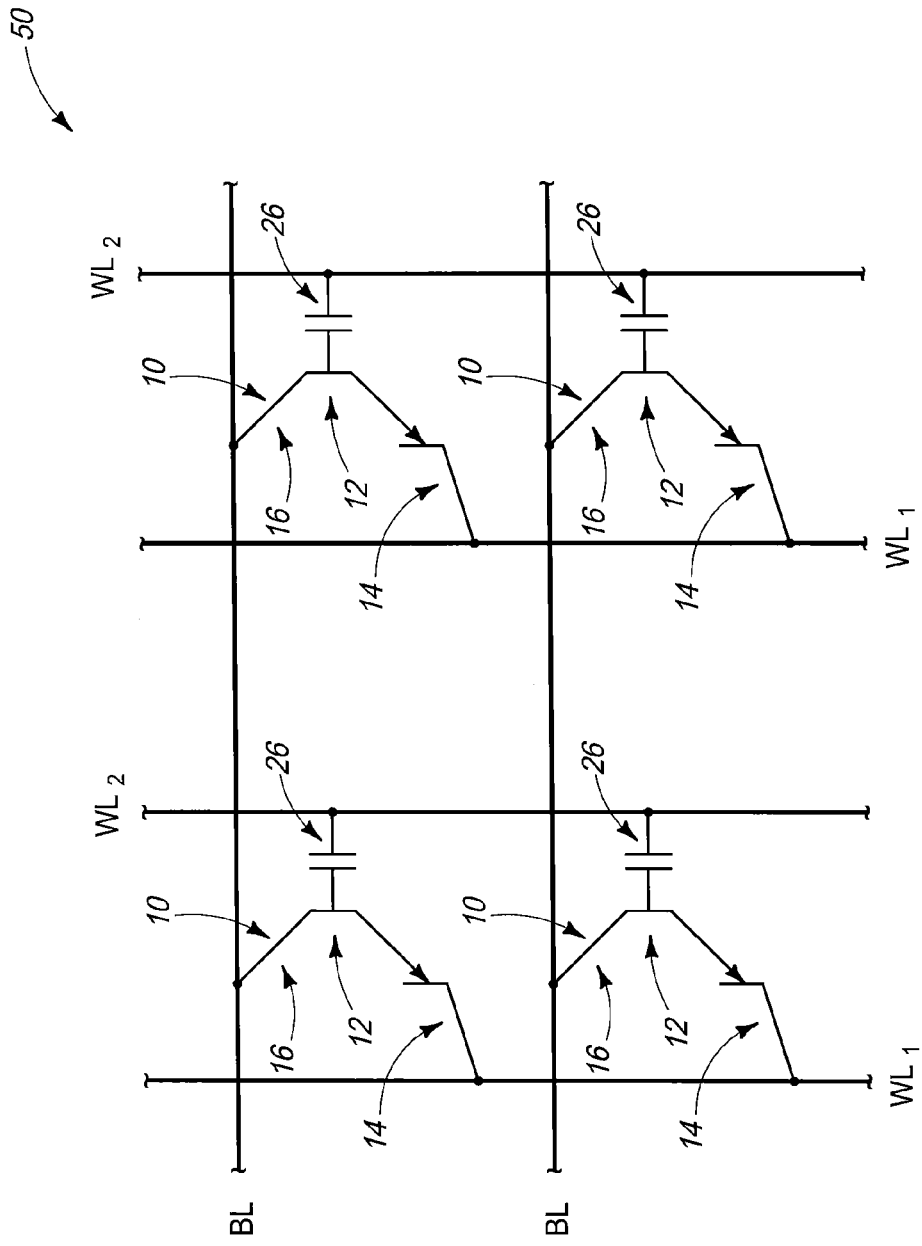
FIG. 5 is a diagrammatic schematic view of an example embodiment memory array comprising memory cells of the type shown in FIG. 1.

The memory cells of FIGS. 1-4 may be utilized in memory arrays. FIG. 5 diagrammatically illustrates a memory array 50 comprising a plurality of memory cells 10 of the type described above with reference to FIG. 1. Each memory cell is schematically illustrated as a gated BJT, with the gate 26 illustrated to be capacitively coupled to the base 12 (the capacitive coupling is through the dielectric 30, which is not shown in FIG. 5). The illustrated BJTs of FIG. 5 have the region 14 as the emitter region and the region 16 as the collector region, but such orientation may be reversed in other embodiments.

The memory array 50 comprises a series of bitlines, a first series of wordlines (the series identified as $WL_1$), and a second series of wordlines (the series identified as $WL_2$). In some embodiments, the node 20 of FIG. 1 may correspond to a bitline (BL), the node 18 of FIG. 1 may correspond to a wordline of the first series ($WL_1$), and the gate 26 of FIG. 1 may be along a wordline of the second series ($WL_2$). In such embodiments, the emitter/collector regions 16 of memory cells 10 may be considered to be first emitter/collector regions which are directly coupled with bitlines, and the emitter/collector regions 14 of the memory cells may be considered to be second emitter/collector regions which are electrically coupled with the first series of wordlines. Each memory cell of array 50 may be uniquely addressed through combinations containing one of the bitlines together with one of the wordlines $WL_2$ and/or one of the wordlines $WL_1$. The wordlines may be alternatively referred to as access lines in some embodiments, and the bitlines may be alternatively referred to as sense lines in some embodiments.

Figure 6:
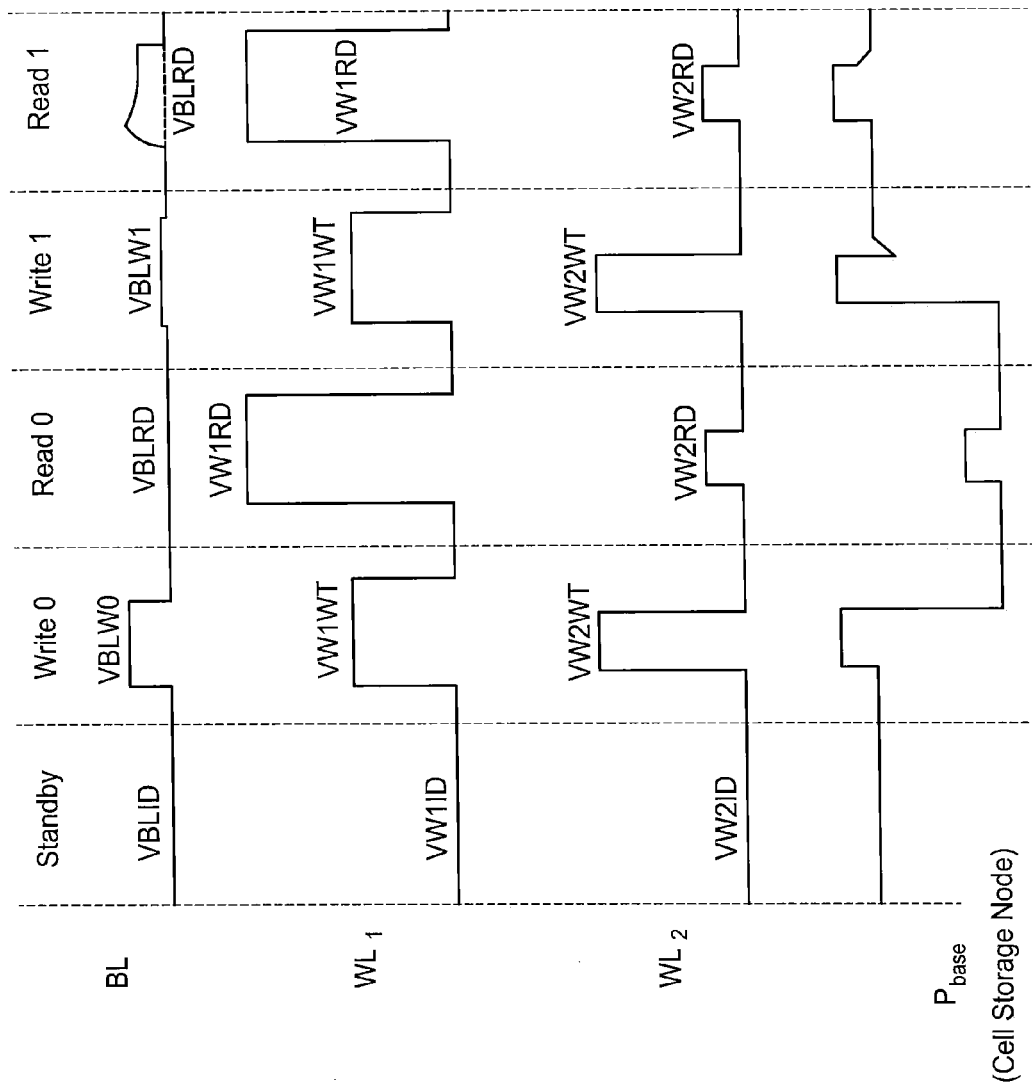
FIG. 6 diagrammatically illustrates an example embodiment operational arrangement for utilizing the memory array of FIG. 5.

FIG. 6 diagrammatically illustrates various operations that may be utilized for programming individual memory cells of the array 50 into a "0" data state (i.e., "write 0" operations), programming the individual memory cells into a "1" data state (i.e., "write 1" operations), and for reading the memory cells to ascertain the data states of the individual memory cells. FIG. 6 also diagrammatically illustrates voltage of the $P_{base}$ (i.e., the base 12 of FIG. 1) during the various operations. Example voltage levels for the various states indicated in FIG. 6 may include (assuming a bandgap of 2.3 eV):

VBLID=0 Volt (V)
VBLW0=2V
VBLRD=0V (D0, 0V; D1, 1V)
VBLW1=0V
VW1ID=0V
VW1WT=3V
VW1RD=5V
VW2ID=-3V
VW2WT=2V
VW2RD=-2V The terms "D0" and "D1" indicate voltages read for the "0" data state and the "1" data state, respectively, of the memory cell. The example operations of FIG. 6 may advantageously achieve a high p-base programming margin (greater than or equal to about 1 V) between the D0 and D1 memory states of the memory cell, which may provide a sufficient charge to enable long retention by the memory cell, and to provide a margin against variation and disturb modes. Also, the various voltages utilized for the reading and writing operations may be kept at relatively low levels (less than or equal to about 5 V) which may enable operation of the memory cell with modest power drain.

Another set of example voltage levels for the various states indicated in FIG. 6 may include (assuming a bandgap of 2.3 eV):

VBLID=0V
VBLW0=3V
VBLRD=0V (D0, 0V; D1, 1V)
VBLW1=0V
VW1ID=0V
VW1WT=5V
VW1RD=5V
VW2ID=-3V
VW2WT=2V
VW2RD=-2V

It is noted that the "write 0" operation has a lower voltage differential between $WL_1$ and the bitline than does the "write 1" operation. The lower voltage differential between the bitline and $WL_1$ allows charge to drain from the $P_{base}$, while the higher voltage differential between the bitline and $WL_1$ results in charge being trapped on the $P_{base}$. Various mechanisms may account for such relationship. For instance, high-voltage differentials between the bitline and $WL_1$ during capacitive coupling of the base with gate 26 can lead to impact ionization, a Kirk effect, a Webster effect and/or other mechanisms which limit charge transfer through the BJT, and thus can lead to charge being trapped on the floating base of the BJT. In contrast, low-voltage differentials between the bitline and $WL_1$ during the capacitive coupling of the gate with the base may permit a steady flow of charge through the BJT, and thus may permit charge to be drained from the floating base.

A possible explanation for the reason that the lower voltage differential between the bitline and $WL_1$ allows charge to drain from the $P_{base}$, while the higher voltage differential between the bitline and $WL_1$ results in charge being trapped on the $P_{base}$ is as follows. When the voltage differential is high, there is impact ionization in the collector-base region. This supplies a base current ($I_b$) to the npn bipolar transistor. A collector current ($I_c$) results, which is related to the base current through Equation II.

$$I_c = \beta * I_b \qquad \text{Equation II}$$

In Equation II, $\beta$ is the npn current gain.

The impact ionization current is equal to $\alpha_n * I_c$, where $\alpha_n$ is the impact ionization efficiency; and is a function of electric field divided by voltage. This leads to the relationship of Equation III.

$$I_b = \alpha_n * I_c \qquad \text{Equation III}$$

If $(\alpha_n * \beta) > 1$, the cell latches. Once the cell latches, the gate (26 of FIG. 5) losses control of the $P_{base}$ and cannot couple to it. Hence, even if the gate voltage is brought down, the $P_{base}$ voltage stays high. In contrast, with a low voltage differential the cell does not latch, the gate has good coupling to the $P_{base}$, and pulling the gate voltage down will also pull the $P_{base}$ voltage down.

Figure 7:
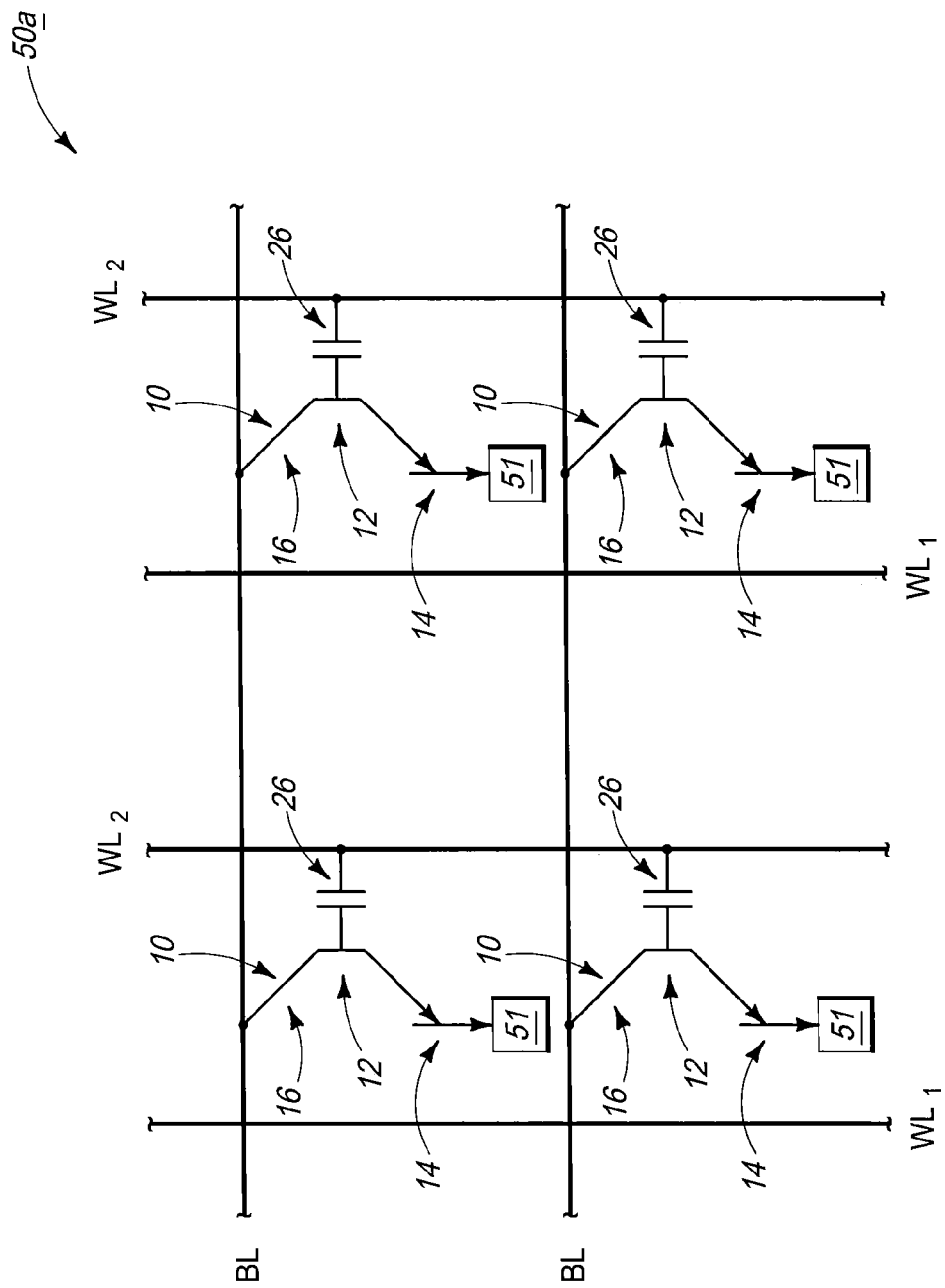
FIG. 7 is a diagrammatic schematic view of another example embodiment memory array comprising memory cells of the type shown in FIG. 1.

FIG. 7 diagrammatically illustrates an example embodiment memory array 50a comprising a plurality of memory cells 10 of the type described above with reference to FIG. 1. The memory array of FIG. 7 is similar to that of FIG. 5, except that the first series of wordlines ($WL_1$ of FIG. 5) has been replaced with nodes 51. The nodes 51 are at a common voltage as one another, and in some embodiments may be electrically coupled with one another and with a common terminal (for instance, they may all be connected to a grounded plate).

In some embodiments, the node 20 of FIG. 1 may correspond to the bitline (BL) of FIG. 7, the node 18 of FIG. 1 may correspond to a node 51, and the gate 26 of FIG. 1 may be along a wordline of the series ($WL_2$). In such embodiments, the emitter/collector regions 16 of memory cells 10 may be considered to be first emitter/collector regions which are directly coupled with bitlines, and the emitter/collector regions 14 of the memory cells may be considered to be second emitter/collector regions which are electrically coupled with one another and with a common terminal. Each memory cell of array 50a may be uniquely addressed through combinations containing one of the bitlines together with one of the wordlines $WL_2$.

Figure 8:
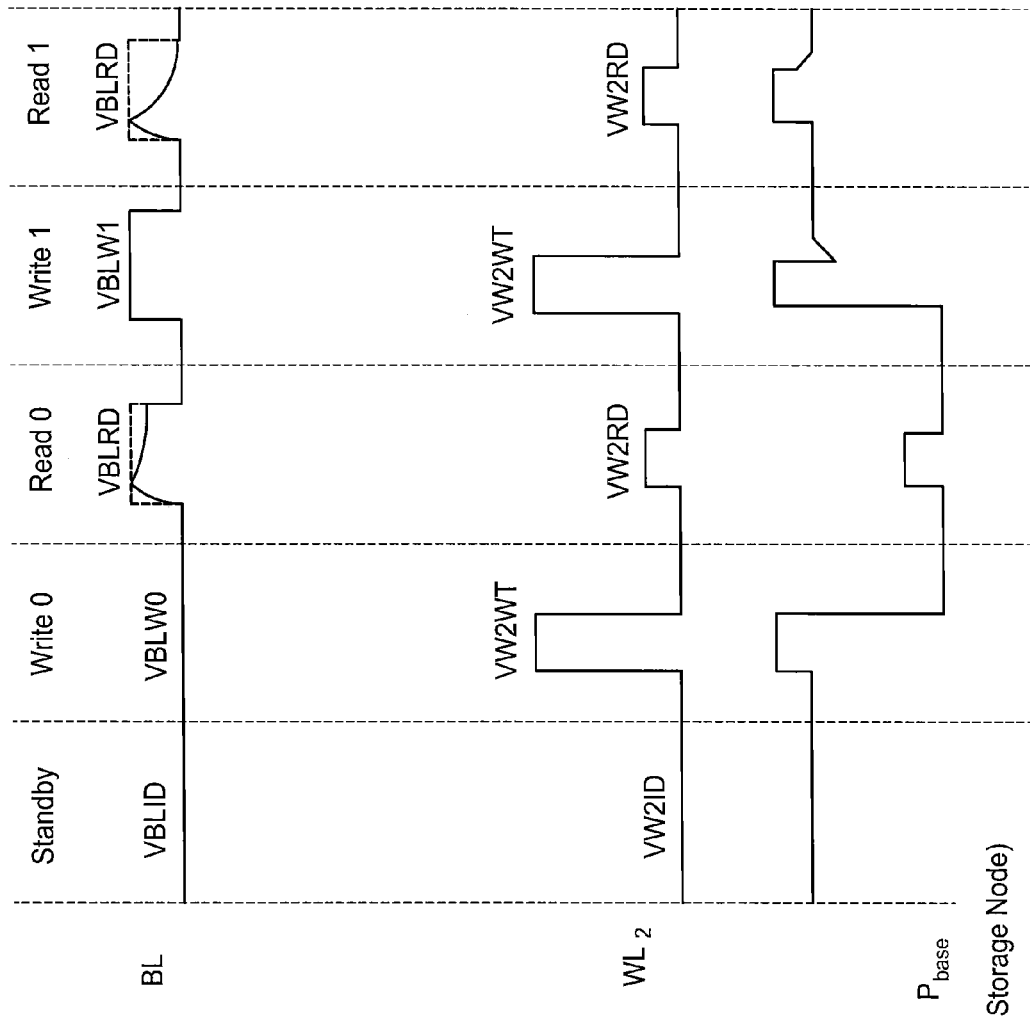
FIG. 8 diagrammatically illustrates an example embodiment operational arrangement for utilizing the memory array of FIG. 7.

FIG. 8 diagrammatically illustrates various operations that may be utilized for programming individual memory cells of the array 50a into a "0" data state (i.e., "write 0" operations), programming the individual memory cells into a "1" data state (i.e., "write 1" operations), and for reading the memory cells to ascertain the data states of the individual memory cells. FIG. 8 also diagrammatically illustrates voltage of the $P_{base}$ (i.e., the base 12 of FIG. 1) during the various operations. Example voltage levels for the various states indicated in FIG. 8 may include (assuming a bandgap of 2.3 eV, and assuming a common voltage on nodes 51 of 0V):

VBLID=2V
VBLW0=2V
VBLRD=5V (D0, 5V; D1, 4V)
VBLW1=4V
VW2ID=-3V
VW2WT=2V
VW2RD=-1.4V

Figure 9:
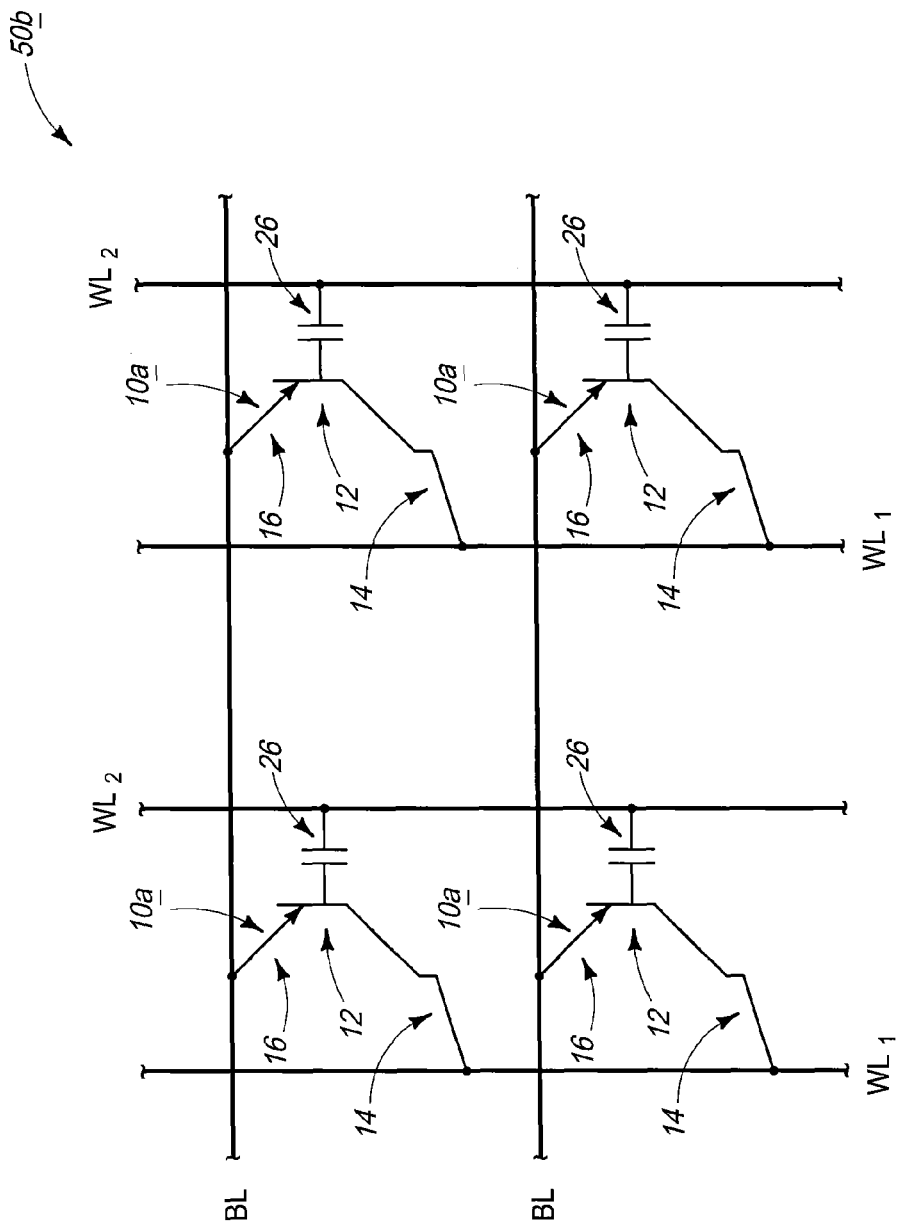
FIG. 9 is a diagrammatic schematic view of an example embodiment memory array comprising memory cells of the type shown in FIG. 2.

FIG. 9 diagrammatically illustrates another example embodiment memory array 50b. The memory array of FIG. 9 comprises a plurality of memory cells 10a of the type described above with reference to FIG. 2. The memory array of FIG. 9, like that of FIG. 5, comprises a series of bitlines, a first series of wordlines (the series identified as $WL_1$), and a second series of wordlines (the series identified as $WL_2$). In some embodiments, the node 20 of FIG. 2 may correspond to a bitline (BL), the node 18 of FIG. 2 may correspond to a wordline of the first series ($WL_1$), and the gate 26 of FIG. 2 may be along a wordline of the second series ($WL_2$). In such embodiments, the emitter/collector regions 16 of memory cells 10a may be considered to be first emitter/collector regions which are directly coupled with bitlines, and the emitter/collector regions 14 of the memory cells may be considered to be second emitter/collector region which are electrically coupled with the first series of wordlines. Each memory cell of array 50b may be uniquely addressed through combinations containing one of the bitlines together with one of the wordlines $WL_2$ and/or one of the wordlines $WL_1$.

Figure 10:
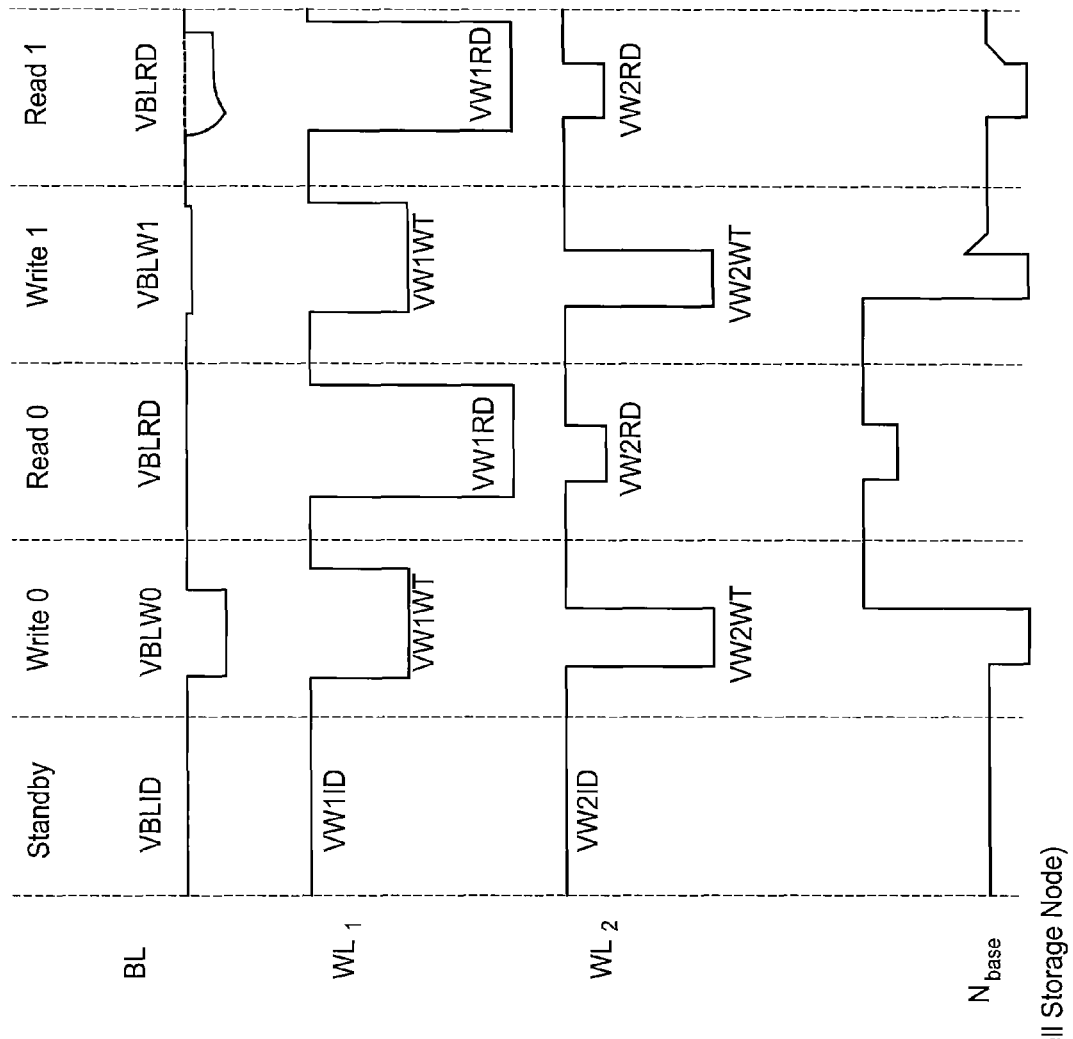
FIGS. 10 and 11 diagrammatically illustrate example embodiment operational arrangements for utilizing the memory array of FIG. 9.

FIG. 10 diagrammatically illustrates various operations that may be utilized for programming individual memory cells of the array 50b into a "0" data state (i.e., "write 0" operations), programming the individual memory cells into a "1" data state (i.e., "write 1" operations), and for reading the memory cells to ascertain the data states of the individual memory cells. FIG. 10 also diagrammatically illustrates voltage of the $N_{base}$ (i.e., the base 12 of FIG. 2) during the various operations. Example voltage levels for the various states indicated in FIG. 10 may include (assuming a bandgap of 2.3 eV):

VBLID=5V
VBLW0=4V
VBLRD=5V (D0, 5V; D1, 4V)
VBLW1=5V
VW1ID=5V
VW1WT=1V
VW1RD=0V
VW2ID=5V
VW2WT=0V
VW2RD=4V

Another set of example voltage levels for the various states indicated in FIG. 10 may include (assuming a bandgap of 2.3 eV):

VBLID=5V
VBLW0=3V
VBLRD=5V (D0, 5V; D1, 4V)
VBLW1=5V
VW1ID=5V
VW1WT=0V
VW1RD=0V
VW2ID=5V
VW2WT=0V
VW2RD=4V

Figure 11:
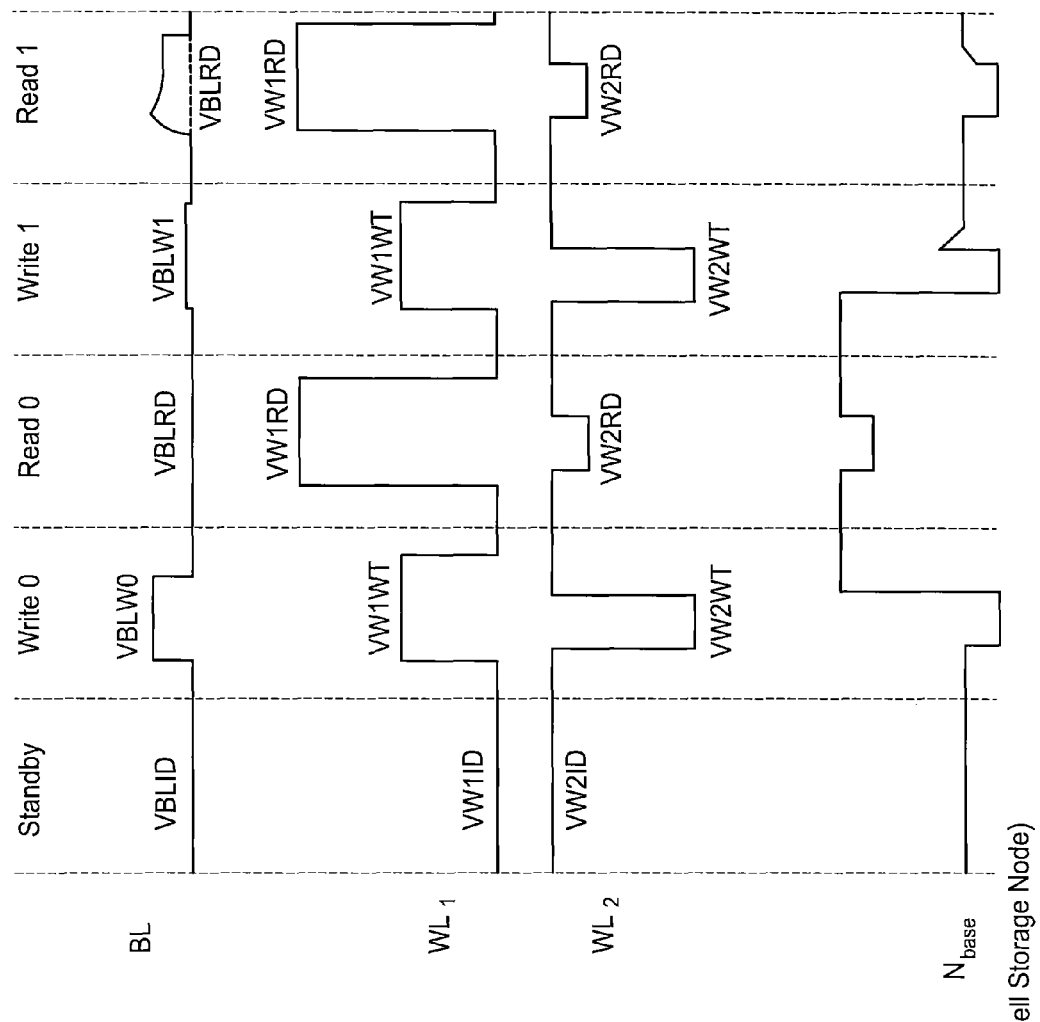

FIG. 11 diagrammatically illustrates another set of operations that may be utilized for programming individual memory cells of the array 50b of FIG. 9 into a "0" data state (i.e., "write 0" operations), programming the individual memory cells into a "1" data state (i.e., "write 1" operations), and for reading the memory cells to ascertain the data states of the individual memory cells. FIG. 11 also diagrammatically illustrates voltage of the $N_{base}$ (i.e., the base 12 of FIG. 2) during the various operations. Example voltage levels for the various states indicated in FIG. 11 may include (assuming a bandgap of 2.3 eV):

VBLID=0V
VBLW0=2V
VBLRD=0V (D0, 0V; D1, 1V)
VBLW1=0V
VW1ID=0V
VW1 WT=4V

VW1RD=5V
VW2ID=5V
VW2WT=0V
VW2RD=4V

Figure 12:
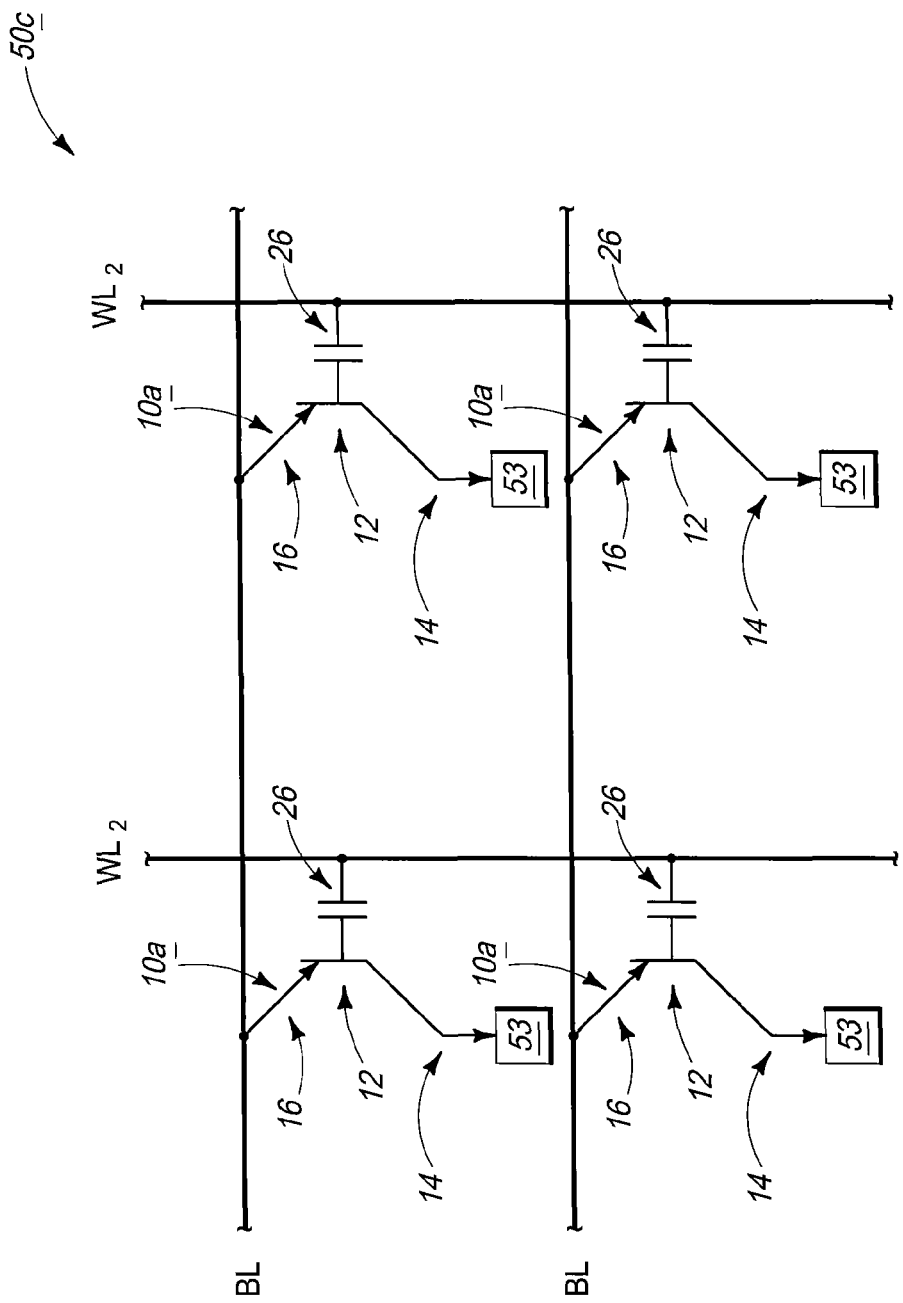
FIG. 12 is a diagrammatic schematic view of another example embodiment memory array comprising memory cells of the type shown in FIG. 2.

Another set of example voltage levels for the various states indicated in FIG. 11 may include (assuming a bandgap of 2.3 eV):
VBLID=0V
VBLW0=3V
VBLRD=0V (D0, 0V; D1, 1V)
VBLW1=0V
VW1ID=0V
VW1WT=5V
VW1RD=5V
VW2ID=5V
VW2WT=0V
VW2RD=4V FIG. 12 diagrammatically illustrates an example embodiment memory array 50c comprising a plurality of memory cells 10a of the type described above with reference to FIG. 2. The memory array of FIG. 12 is similar to that of FIG. 9, except that the first series of wordlines ($WL_1$ of FIG. 9) have been replaced with nodes 53. The nodes 53 are at a common voltage as one another, and in some embodiments may be electrically coupled with one another and with a common terminal (for instance, they may all be connected to an electrically conductive plate).

In some embodiments, the node 20 of FIG. 2 may correspond to the bitline (BL) of FIG. 12, the node 18 of FIG. 2 may correspond to a node 53, and the gate 26 of FIG. 2 may be along a wordline of the series ($WL_2$). In such embodiments, the emitter/collector regions 16 of memory cells 10a may be considered to be first emitter/collector regions which are directly coupled with bitlines, and the emitter/collector regions 14 of the memory cells may be considered to be second emitter/collector regions which are electrically coupled with one another and with a common terminal. Each memory cell of array 50c may be uniquely addressed through combinations containing one of the bitlines together with one of the wordlines $WL_2$.

Figure 13:
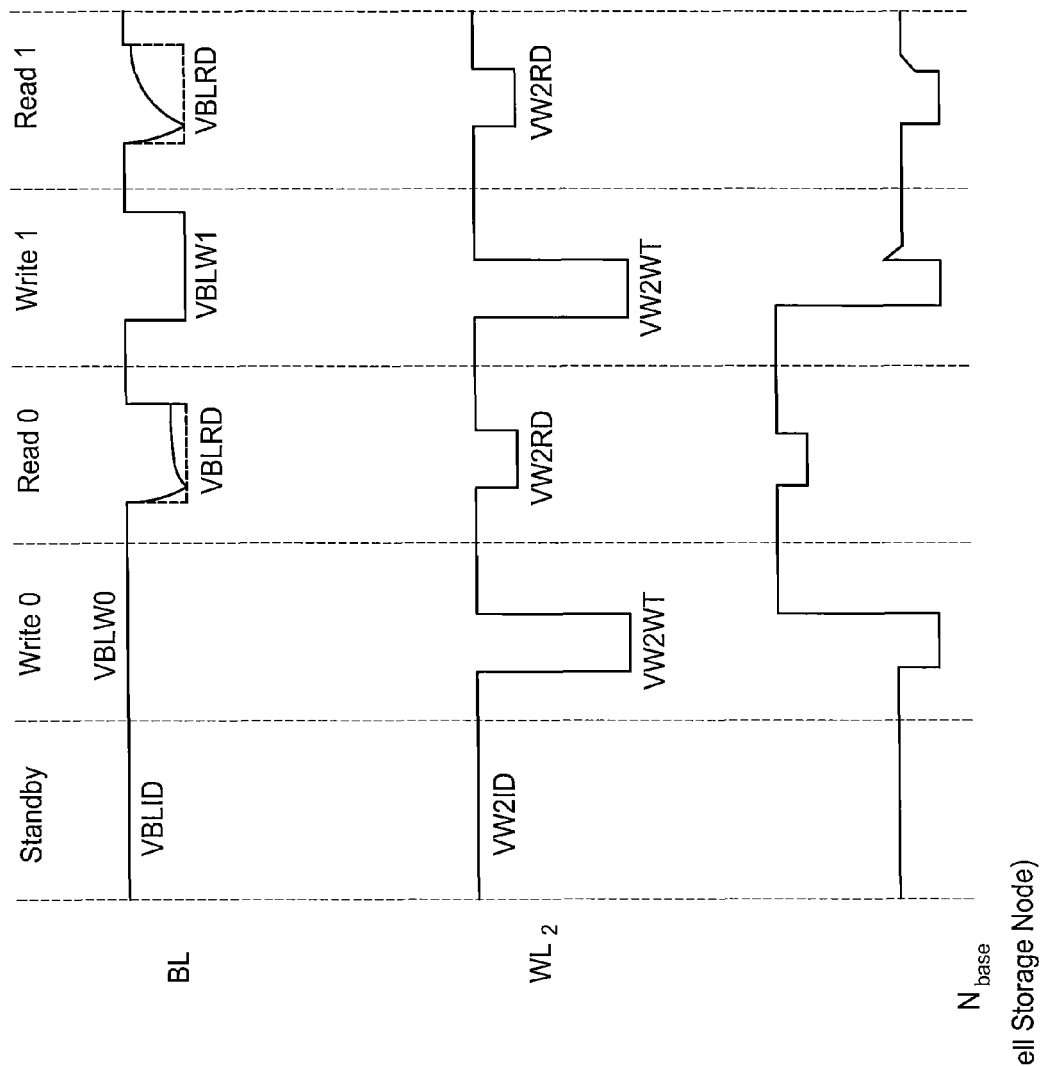
FIGS. 13 and 14 diagrammatically illustrate example embodiment operational arrangements for utilizing the memory array of FIG. 12.
Figure 14:
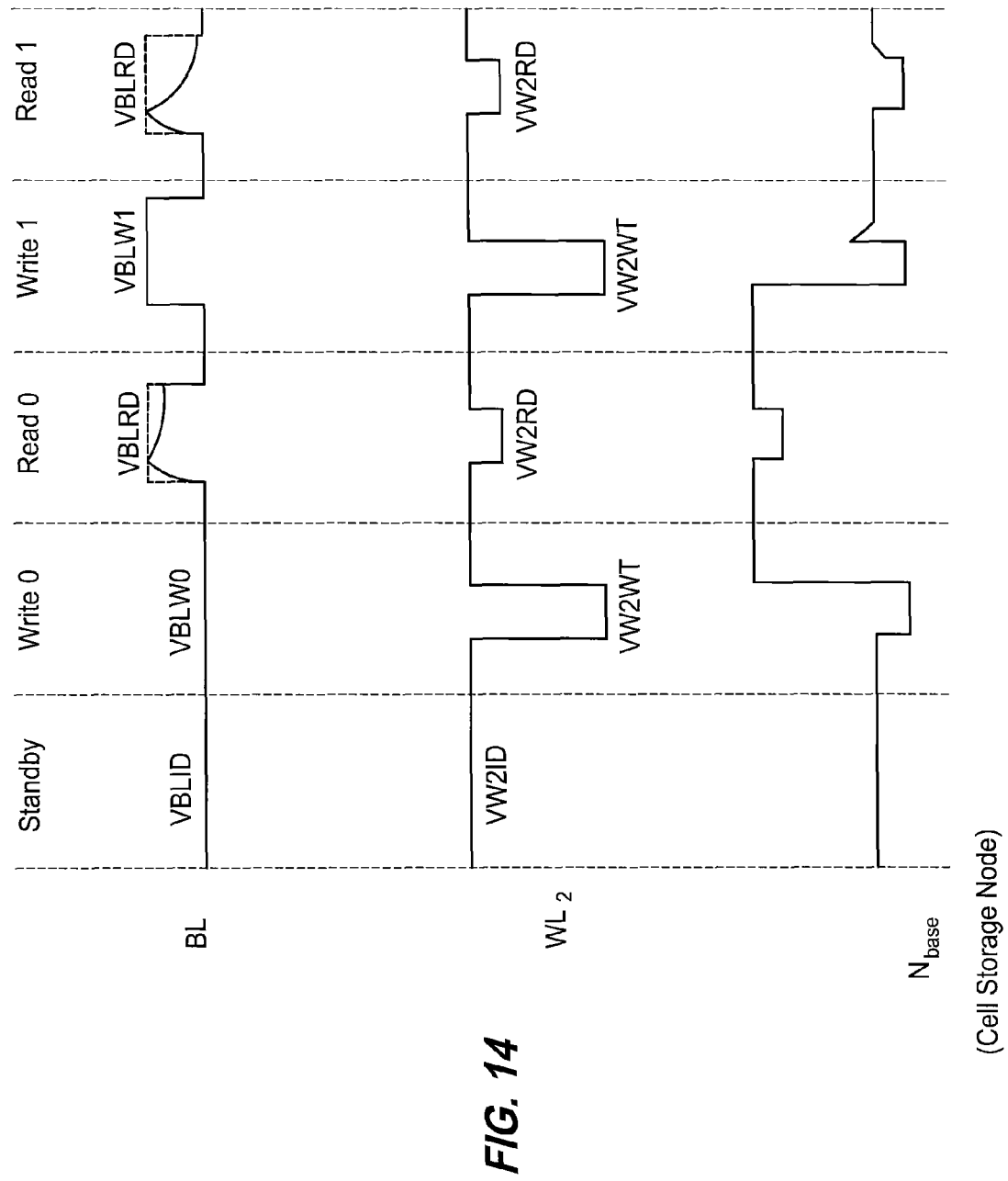
Figure 16:
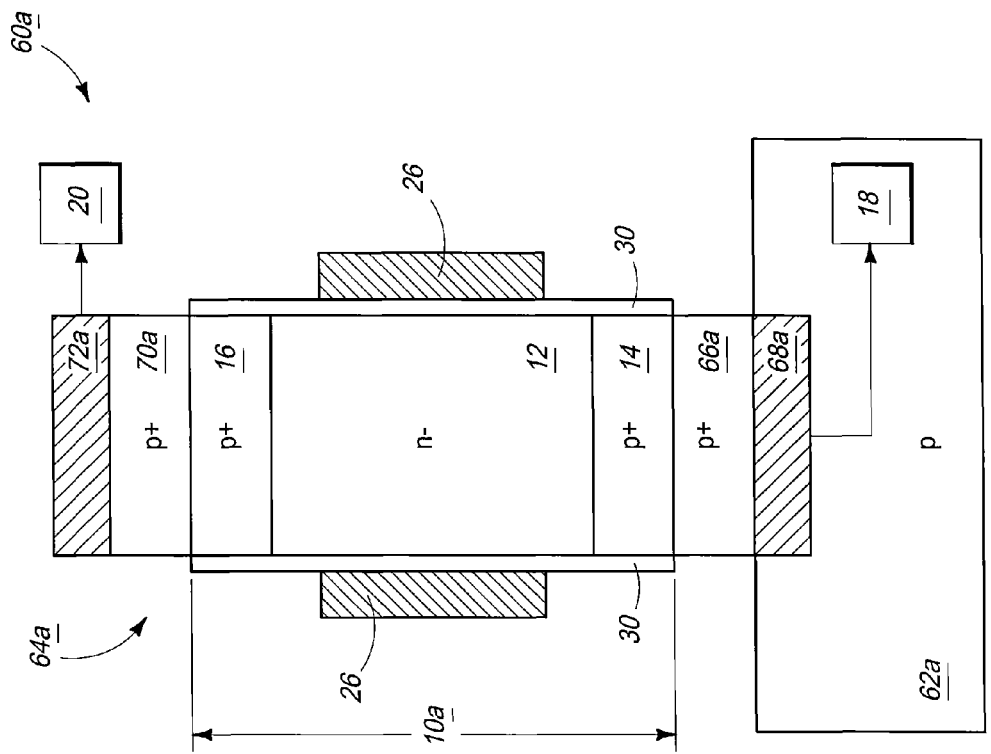
FIG. 16 is a diagrammatic cross-sectional view of another example embodiment memory cell.
Figure 15:
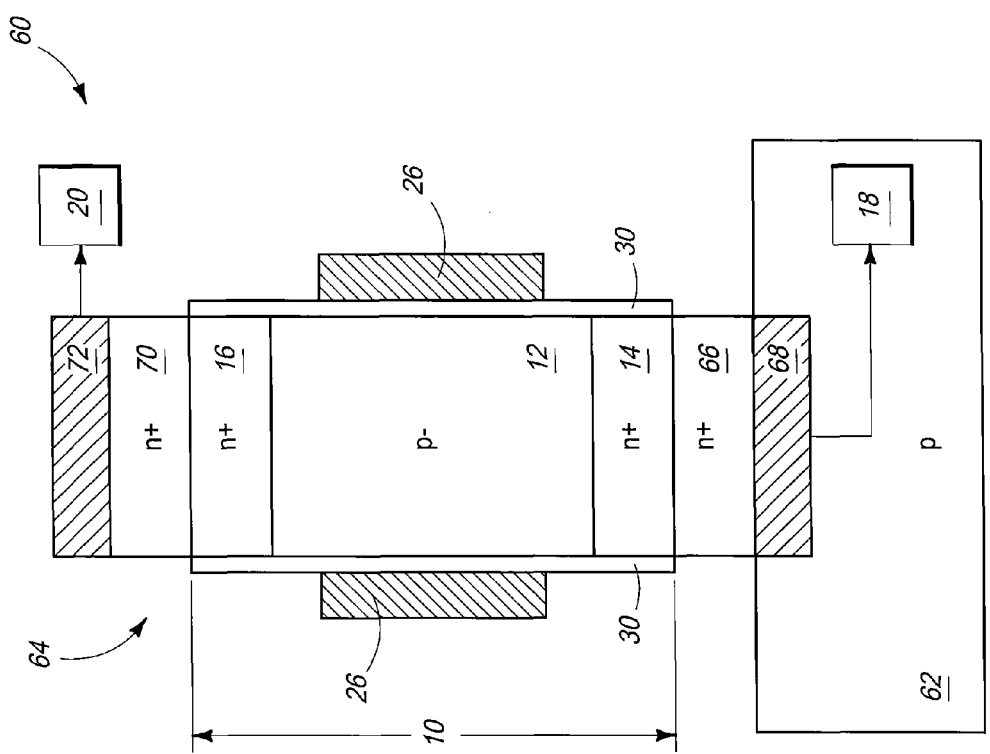
FIG. 15 is a diagrammatic cross-sectional view of another example embodiment memory cell.

FIG. 13 diagrammatically illustrates various operations that may be utilized for programming individual memory cells of the array 50c into a "0" data state (i.e., "write 0" operations), programming the individual memory cells into a "1" data state (i.e., "write 1" operations), and for reading the memory cells to ascertain the data states of the individual memory cells. FIG. 13 also diagrammatically illustrates voltage of the $N_{base}$ (i.e., the base 12 of FIG. 2) during the various operations. Example voltage levels for the various states indicated in FIG. 13 may include (assuming a bandgap of 2.3 eV, and assuming a common voltage on nodes 53 of 5V):
VBLID=3V
VBLW0=3V
VBLRD=0V (D0, 0V; D1, 1V)
VBLW1=0V
VW2ID=5V
VW2WT=0V
VW2RD=3.4V FIG. 14 diagrammatically illustrates another set of operations that may be utilized for programming individual memory cells of the array 50c of FIG. 12 into a "0" data state (i.e., "write 0" operations), programming the individual memory cells into a "1" data state (i.e., "write 1" operations), and for reading the memory cells to ascertain the data states of the individual memory cells. FIG. 14 also diagrammatically illustrates voltage of the $N_{base}$ (i.e., the base 12 of FIG. 2) during the various operations. Example voltage levels for the various states indicated in FIG. 14 may include (assuming a bandgap of 2.3 eV, and assuming a common voltage on nodes 53 of 0V):
VBLID=2V
VBLW0=2V
VBLRD=5V (D0, 5V; D1, 4V)
VBLW1=4V
VW2ID=5V
VW2WT=0V
VW2RD=3.4V The memory cells of FIGS. 1-4 may be readily incorporated into semiconductor constructions. FIGS. 15 and 16 illustrate example semiconductor constructions comprising the memory cell 10 of FIG. 1, and the memory cell 10a of FIG. 2, respectively.

Referring to FIG. 15, a semiconductor construction 60 comprises memory cell 10 supported over a semiconductor substrate 62. The substrate 62 may comprise, consist essentially of, or consist of monocrystalline silicon in some embodiments, and is shown to be p-type background doped. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although substrate 62 is shown to be homogenous, the substrate may comprise numerous materials in some embodiments. For instance, substrate 62 may correspond to a semiconductor substrate containing one or more materials associated with integrated circuit fabrication. Example materials that may be associated with integrated circuit fabrication are various of refractory metal materials, barrier materials, diffusion materials, insulator materials, etc.

The memory cell 10 is part of a substantially vertical pillar 64. Such pillar includes an n-type doped segment 66 directly over the semiconductor material of substrate 62 (the segment 66 is shown doped to an n+ dopant level). In some embodiments, segment 66 may comprise monocrystalline silicon patterned from substrate 62, and/or may comprise semiconductor material deposited over substrate 62. The segment 66 is shown electrically coupled with an electrically conductive material 68 that interconnects with node 18. The conductive material 68 may be any suitable material; including, for example, any of various metals, metal-containing compositions, and/or conductive-doped semiconductor materials. The conductive material 68 may be a separate material from the conductively-doped material of segment 66 (as shown), or may be an extension of the conductively-doped material 66. In some embodiments, segment 66 may be omitted and emitter/collector region 14 may directly contact a conductive node 18 comprising, consisting essentially of, or consisting of any of various metals and/or metal-containing compositions.

The pillar 64 is referred to as being "substantially vertical" to indicate that it extends substantially orthogonally to a primary upper surface of the substrate. Specifically, the term "vertical" is used herein to define a relative orientation of an element or structure with respect to a major plane or surface of a wafer or substrate. A structure may be referred to as being "substantially vertical" to indicate that the structure is vertical to within reasonable tolerances of fabrication and measurement.

The pillar 64 also includes an n-type doped segment 70 directly over the emitter/collector region 16. The segment 70 may comprise silicon and/or any other suitable semiconductor material. The segment 70 is shown electrically coupled with an electrically conductive material 72 that interconnects with node 20. The conductive material 72 may be any suitable material; including, for example, any of various metals, metal-containing compositions, and/or conductive-doped semiconductor materials. The conductive material 72 may be a separate material from the conductively-doped material of segment 70 (as shown), or may be an extension of the conductively-doped material 70. In some embodiments, segment 70 may be omitted and emitter/collector region 16 may directly contact a conductive node 20 comprising, consisting essentially of, or consisting of any of various metals and/or metal-containing compositions.

Referring to FIG. 16, a semiconductor construction 60a comprises memory cell 10a supported over a semiconductor substrate 62a. The substrate 62a may comprise any of the compositions discussed above with reference to the substrate 62 of FIG. 15.

The memory cell 10a is part of a substantially vertical pillar 64a. Such pillar includes a p-type doped segment 66a directly over the semiconductor material of substrate 62a. The segment 66a is shown electrically coupled with an electrically conductive material 68a that interconnects with node 18. The conductive material 68a may be any of the materials discussed above with reference to the material 68 of FIG. 15. The conductive material 68a may be a separate material from the conductively-doped material of segment 66a (as shown), or may be an extension of the conductively-doped material 66a. In some embodiments, segment 66a may be omitted and emitter/collector region 14 may directly contact a conductive node 18 comprising, consisting essentially of, or consisting of any of various metals and/or metal-containing compositions.

The pillar 64a also includes a p-type doped segment 70a directly over the emitter/collector region 16. The segment 70a may comprise silicon and/or any other suitable semiconductor material. The segment 70a is shown electrically coupled with an electrically conductive material 72a that interconnects with node 20. The conductive material 72a may comprise any of the materials discussed above with reference to the material 72 of FIG. 15. The conductive material 72a may be a separate material from the conductively-doped material of segment 70a (as shown), or may be an extension of the conductively-doped material 70a. In some embodiments, segment 70a may be omitted and emitter/collector region 16 may directly contact a conductive node 20 comprising, consisting essentially of, or consisting of any of various metals and/or metal-containing compositions.

In some embodiments, the memory cells having wide-bandgap material may be formed along one or more levels (or tiers) of an integrated circuit chip, and may be formed over one or more levels of logic or other circuitry fabricated by conventional methods (for instance, such other circuitry may comprise MOSFET transistors). Additionally, or alternatively, one or more levels of conventional circuitry may be fabricated over the memory cells containing the wide-bandgap material.

Figure 18:
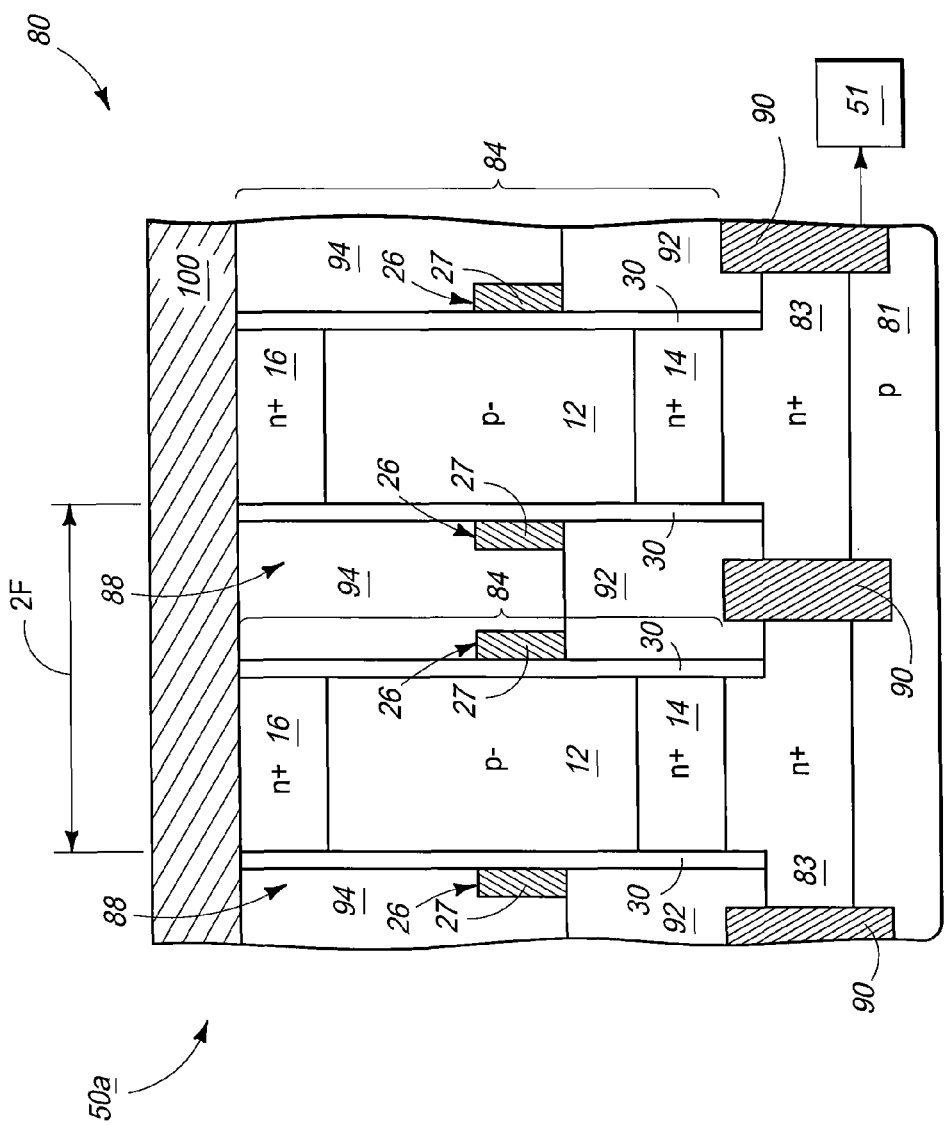

The various memory cells and memory arrays of FIGS. 1-16 may be formed utilizing any suitable processing. For instance, FIGS. 17 and 18 illustrate an example process for fabricating a memory array 50a of the type shown in FIG. 7 comprising memory cells 10 of the type shown in FIG. 1.

Referring to FIG. 17, a semiconductor construction 80 comprises a substrate 82 having an n-type doped region 83 over a p-type doped region 81. The substrate 82 may be a semiconductor substrate analogous to the substrate 62 discussed above with reference to FIG. 15. Accordingly, the regions 81 and 83 may be conductively-doped regions of a monocrystalline silicon wafer, and/or may be conductively-doped regions formed along a tier of a partially-fabricated integrated circuit.

Conductively-doped regions 12, 14 and 16 of a memory cell stack 84 are formed over substrate 82. In some embodiments, the entire stack 84 may comprise, consist essentially of, or consist of doped wide-bandgap material (such as, for example, 3C-SiC). If doped region 83 comprises monocrystalline silicon and the wide-bandgap material comprises silicon carbide, the wide-bandgap material may be epitaxially grown over the monocrystalline silicon.

A difficulty encountered in incorporating wide-bandgap materials (such as, for example, silicon carbide) into integrated circuit fabrication sequences is that dopant activation within the wide-bandgap materials may utilize a thermal budget which is too high for many of the components conventionally utilized in integrated circuitry. A method of reducing the thermal budget for dopant activation is to in situ dope the wide-bandgap material during epitaxial growth of such material.

A patterned mask 97 is formed over memory cell stack 84, with such patterned mask defining a pattern corresponding to a plurality of openings 99 that extend through the mask. The patterned mask may comprise any suitable composition and may be formed with any suitable processing. For instance, the mask may comprise photolithographically-patterned photoresist. As another example, the mask may comprise one or more structures formed utilizing pitch multiplication methodologies.

Referring to FIG. 18, a pattern is transferred from mask 97 (FIG. 17) into stack 84 with one or more suitable etches, and then the mask is removed. The memory cell stack 84 is thus patterned into substantially vertical BJT pillars 88. Subsequently, dielectric material 30 is formed along sidewalls of the pillars.

Electrically-conductive interconnects 90 are formed between the pillars and in electrical connection with doped region 83. The interconnects 90 may be electrically coupled with one another through doped region 83 and/or through other interconnections, and may all be electrically connected to a common terminal so that they are all tied to the common voltage 51 (as shown).

The dielectric material 30 may be formed by initially providing surface passivation along outer exposed surfaces of pillars 88. Such surface passivation may comprise providing a layer containing silicon, oxygen and nitrogen along the outer surfaces. Such layer may be formed by nitridation/oxidation of exposed outer surfaces of silicon carbide in some embodiments, and/or by deposition of passivation material along the exposed outer surfaces. The dielectric material 30 may consist of the passivation layer in some embodiments. In other embodiments, additional dielectric materials may be formed along the passivation layer to form a dielectric material 30 comprising the passivation layer in combination with other dielectric materials. Such other dielectric materials may comprise, for example, one or both of silicon dioxide and silicon nitride.

In some embodiments, material 90 may comprise metal or other thermally-sensitive material, and an advantage of forming conductive material 90 after the doping of wide-bandgap material is that such can avoid exposure of the thermally-sensitive material to the thermal budget utilized for the doping of the wide-bandgap material.

Electrically insulative material 92 is formed over conductive material 90 and between the pillars 88, and then the conductive material 27 is formed and patterned over insulative material 92 to form the gates 26. Subsequently, another insulative material 94 is formed over gates 26 and insulative material 92. The electrically insulative materials 92 and 94 may comprise any suitable compositions or combinations of compositions, including for example, one or more of silicon dioxide, silicon nitride, and any of various doped oxide glasses (for instance, borophosphosilicate glass, phosphosilicate glass, fluorosilicate glass, etc.). The electrically insulative materials 92 and 94 may be the same composition as one another in some embodiments, and may differ in composition from one another in other embodiments.

A bitline 100 is formed across the pillars 88, and in direct electrical contact with the upper doped regions 16 within such pillars. The bitline 100 may be considered to be an example of a node 20 (FIG. 1) that may be formed in direct electrical connection with the upper emitter/collector regions 16 of the illustrated example embodiment memory cells. Bitline 100 may comprise any suitable electrically conductive material, and may, for example, comprise, consist essentially of, or consist of one or more of various metals, metal-containing compositions and conductively-doped semiconductor materials. Although the bitline is shown formed directly against the emitter/collector region 16, in other embodiments there may be one or more electrically-conductive materials between the bitline and the emitter/collector region (such as, for example, an electrically conductive material analogous to the conductively-doped semiconductor material 70 of FIG. 15).

The construction 80 has a dimension from one side of a pillar to a same side of an adjacent pillar of 2F, and thus the individual memory cells may have footprints of about $4F^2$.

Although FIGS. 17 and 18 pertain to formation of memory cells 10 of the type shown in FIG. 1 in a memory array of the type shown in FIG. 7, persons of ordinary skill will recognize that similar processing may be utilized to form any of the other memory cells described in this disclosure in any of the memory arrays described in this disclosure.

The memory cells and memory arrays discussed above may be incorporated into integrated circuit chips or packages, and such may utilized in electronic devices and/or systems. The electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A semiconductor construction, comprising:
    a gated bipolar junction transistor which includes:
        a base region between a collector region and an emitter region;
        a B-C junction at an interface of the base region and the collector region;
        a B-E junction at an interface of the base region and the emitter region;
        at least part of at least one of the base region, the collector region and the emitter region comprising at least one wide bandgap material, said at least one wide bandgap material having a bandgap of at least 1.2 eV; and
        a gate along the base region and spaced from the base region by dielectric material; the gate not overlapping either the B-C junction or the B-E junction.

2. The semiconductor construction of claim 1, wherein the base region comprises a first dopant type, and wherein each of the emitter region and the collector region comprises a second dopant type which is opposite to the first dopant type.

3. The semiconductor construction of claim 1, wherein the base region, the emitter region and the collector region all comprise a common dopant type as one another, and wherein the base region is less heavily doped than either of the emitter region and the collector region.

4. The semiconductor construction of claim 1, further comprising:
    a mode of operation in which there is a B-E depletion region that extends across the B-E junction, and in which there is a B-C depletion region that extends across the B-C junction; and
    the gate not overlapping either of the B-E depletion region and the B-C depletion region.

5. The semiconductor of claim 4, wherein the B-E depletion region and the B-C depletion region are entirely contained within the at least one of wide bandgap material having the bandgap of at least 1.2 eV.

6. The semiconductor construction of claim 5, wherein the wide bandgap material of the B-E depletion region and the wide bandgap material of the B-C depletion region are the same.

7. The semiconductor construction of claim 5, wherein the wide bandgap material of the B-E depletion region is different from the wide bandgap material of the B-C depletion region.

8. The semiconductor construction of claim 5, wherein the wide bandgap material having the bandgap of at least 1.2 eV extends entirely across the base region.

9. The semiconductor construction of claim 1, wherein the wide bandgap material having the bandgap of at least 1.2 eV comprises silicon and carbon.

10. The semiconductor construction of claim 1, wherein the base region, the emitter region and the collector region are entirely comprised by the at least one wide bandgap material having the bandgap of at least 1.2 eV.

11. The semiconductor construction of claim 10, wherein the wide bandgap material of the emitter region and the wide bandgap material of the base region are the same, wherein the wide bandgap material having the bandgap of at least 1.2 eV.

12. The semiconductor construction of claim 10, wherein the wide bandgap material of the emitter region is different from the wide bandgap material of the base region, wherein the wide bandgap material of each of the emitter region and the base region having the bandgap of at least 1.2 eV.

13. The semiconductor construction of claim 10, wherein the wide bandgap material of the collector region and the wide bandgap material of are the same, wherein the wide bandgap material having the bandgap of at least 1.2 eV.

14. The semiconductor construction of claim 10, wherein the wide bandgap material of the collector region is different from the wide bandgap material of the base region, wherein the wide bandgap material of each of the collector region and the base region having the bandgap of at least 1.2 eV.

15. The semiconductor construction of claim 10, wherein the wide bandgap material of the base region, the wide bandgap material of emitter region and the wide bandgap material of collector region are the same, wherein the wide bandgap material having the bandgap of at least 1.2 eV.

16. The semiconductor construction of claim 1, further comprising:
one of the emitter region and the collector region being coupled with a bitline and being a first region, and the other one of the emitter region and the collector region being coupled with a node and being a second region; and
wherein the wide bandgap material having the bandgap of at least 1.2 eV extends entirely across the first region.

17. The semiconductor construction of claim 16, wherein the wide bandgap material having the bandgap of at least 1.2 eV also extends entirely across the second region.

18. A semiconductor construction, comprising:
a gated bipolar junction transistor which includes:
a base region between a collector region and an emitter region;
a B-C junction at an interface of the base region and the collector region;
a B-E junction at an interface of the base region and the emitter region;
at least part of at least one of the base region, the collector region and the emitter region comprising a wide bandgap material, said wide bandgap material having a bandgap of at least 2.3 eV;
a gate along the base region and spaced from the base region by a dielectric material; and
the gate being only coupled with the base region in operation such that any gate induced leakage is less than the combination of base/emitter junction leakage and base/collector junction leakage.

19. The semiconductor construction of claim 18, wherein the B-C junction is within the wide bandgap material having the bandgap of at least about 2.3 eV.

20. The semiconductor construction of claim 18, wherein the B-E junction is within the wide bandgap material having the bandgap of at least about 2.3 eV.

21. The semiconductor construction of claim 18, wherein the wide bandgap material of the B-C junction and the wide bandgap material of the B-E junction are the same, wherein the wide bandgap material having the bandgap of at least about 2.3 eV.

22. The semiconductor construction of claim 18, wherein the wide bandgap material having the bandgap of at least about 2.3 eV comprises silicon and carbon.

* * * * *

UNITED STATES PATENT AND TRADEMARK OFFICE
CERTIFICATE OF CORRECTION

PATENT NO. : 8,952,418 B2  
APPLICATION NO. : 13/037642  
DATED : February 10, 2015  
INVENTOR(S) : Gupta et al.

Page 1 of 1

It is certified that error appears in the above-identified patent and that said Letters Patent is hereby corrected as shown below:

In the claims

Column 16, line 49, Claim 5, after "semiconductor" insert -- construction --.

Column 17, line 14, Claim 13, after "of" insert -- the base region --.

Signed and Sealed this
Twelfth Day of May, 2015

Michelle K. Lee
*Director of the United States Patent and Trademark Office*